US010574250B1

(12) United States Patent
Braswell et al.

(10) Patent No.: US 10,574,250 B1
(45) Date of Patent: Feb. 25, 2020

(54) DIGITAL CALIBRATION SYSTEMS AND METHODS FOR MULTI-STAGE ANALOG-TO-DIGITAL CONVERTERS

(71) Applicant: NXP USA, Inc., Austin, TX (US)

(72) Inventors: Brandt Braswell, Chandler, AZ (US); George Kunnen, Chandler, AZ (US); Mark Lancaster, Scottsdale, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/288,396

(22) Filed: Feb. 28, 2019

(51) Int. Cl.
*H03M 1/10* (2006.01)

(52) U.S. Cl.
CPC .................. *H03M 1/1033* (2013.01)

(58) Field of Classification Search
CPC ................................. H03M 1/1033
USPC ................................. 341/120–155
See application file for complete search history.

(56) References Cited

U.S. PATENT DOCUMENTS

| | | | |
|---|---|---|---|
| 5,635,937 A * | 6/1997 | Lim ...................... | H03M 1/168 341/118 |
| 6,911,925 B1 * | 6/2005 | Slavin ................. | H03M 1/0626 341/117 |
| 7,142,138 B2 | 11/2006 | Chen et al. | |
| 8,451,159 B1 | 5/2013 | Gupta et al. | |
| 8,487,794 B2 | 7/2013 | Huang et al. | |
| 8,542,138 B2 | 9/2013 | Galton et al. | |
| 8,723,707 B2 | 5/2014 | Ali | |
| 8,830,099 B1 | 9/2014 | Straayer et al. | |
| 8,917,125 B1 | 12/2014 | Waltari | |
| 9,154,146 B1 * | 10/2015 | Chiu ...................... | H03M 1/069 |
| 9,219,493 B1 * | 12/2015 | Kunnen ................ | H03M 3/496 |
| 9,323,226 B1 | 4/2016 | Waltari | |
| 9,634,681 B1 | 4/2017 | Kunnen et al. | |
| 9,706,497 B2 * | 7/2017 | Tian ........................ | H04B 5/00 |
| 9,768,793 B2 * | 9/2017 | Meng ..................... | H03M 1/08 |
| 9,838,031 B2 * | 12/2017 | Dong .................... | H03M 3/322 |
| 9,893,739 B2 * | 2/2018 | Bode .................. | H03M 1/1023 |
| 9,945,901 B1 * | 4/2018 | Otte .................. | G01R 31/2851 |
| 9,991,900 B1 * | 6/2018 | Kabir ................... | H03M 1/067 |

(Continued)

OTHER PUBLICATIONS

Khalil et al., "Background Analog and Mixed Signal Calibration System for Time-Interleaved ADC", Microelectronics Journal, vol. 46, Issue 7, Jul. 2015, 12 pgs.

(Continued)

*Primary Examiner* — Lam T Mai

(57) ABSTRACT

Digital calibration systems and related methods are disclosed for multi-stage analog-to-digital converters (ADCs). For one embodiment, a multi-stage ADC includes an initial ADC, an additional ADC, and calibration logic. The initial ADC generates an output signal and N-bit digital values that are based upon an input signal. The additional ADC receives the output signal from the initial ADC and generates M-bit digital values that are based upon the output signal. The calibration logic receives the N-bit digital values and the M-bit digital values and generates correction values. The correction values are based upon differences between maximum values and minimum values for M-bit digital values associated with different regions determined by the N-bit digital values. Digital conversion outputs for the multi-stage ADC are provided as combinations of the N-bit digital values and the M-bit digital values corrected with the correction values.

20 Claims, 12 Drawing Sheets

(56) References Cited

U.S. PATENT DOCUMENTS

| | | | |
|---|---|---|---|
| 10,033,399 | B1 | 7/2018 | Braswell et al. |
| 10,243,577 | B1* | 3/2019 | Berens ................ H03M 1/1047 |
| 2005/0137817 | A1* | 6/2005 | Bardsley ............. H03M 1/1038 |
| | | | 702/106 |
| 2006/0077141 | A1 | 4/2006 | Kwon |
| 2008/0165040 | A1* | 7/2008 | Rotchford ........... H03M 1/1047 |
| | | | 341/120 |
| 2016/0182075 | A1* | 6/2016 | Devarajan ........... H03M 1/1019 |
| | | | 341/120 |
| 2017/0126237 | A1* | 5/2017 | Pavao Moreira ..... H03L 7/0991 |
| 2019/0131990 | A1* | 5/2019 | Ali ........................ H03M 1/002 |
| 2019/0173481 | A1* | 6/2019 | Ali ...................... H03M 1/1033 |
| 2019/0296756 | A1* | 9/2019 | Ali .......................... H03F 1/301 |
| 2019/0305791 | A1* | 10/2019 | Ali ...................... H03M 1/1033 |

OTHER PUBLICATIONS

El-Sankary et al., "High-Resolution Background Calibrated ADCs for Software-Defined Radios", Microelectronics Journal, vol. 37, Issue 11, Nov. 2006, 10 pgs.

Kurosawa et al., "Explicit Formula for Channel Mismatch Effects in Time-Interleaved ADC Systems", Proceedings of the 17th IEEE Instrumentation and Measurement Technology Conference, May 2000, 6 pgs.

Kurosawa et al., "Explicit Analysis of Channel Mismatch Effects in Time-Interleaved ADC Systems", IEEE Transactions on Circuits and Systems, vol. 48, No. 3, Mar. 2001, 11 pgs.

Liu et al., "Adaptive Calibration of Channel Mismatches in Time-Interleaved ADCs Based on Equivalent Signal Recombination", IEEE Transactions on Instrumentation and Measurement, vol. 63, No. 2, Feb. 2014, 10 pgs.

Brandolini et al., "A 5 GS/s 150 nW 10 b SHA-Less Pipelined/SAR Hybrid ADC for Direct-Sampling Systems in 28 nm CMOS", IEEE Journal of Solid-State Circuits, vol. 50, No. 12, Dec. 2015, 13 pgs.

Braswell, et al., U.S. Patent Application (Filed Concurrently Herewith), entitled "MDAC Based Time-Interleaved Analog-To-Digital Converters and Related Methods," 47 Pages.

Braswell, et al., U.S. Patent Application (Filed Concurrently Herewith), entitled "Current Controlled MDAC for Time-Interleaved ADCs and Related Methods," 48 Pages.

* cited by examiner

DIGITAL CALIBRATION SYSTEMS AND METHODS FOR MULTI-STAGE ANALOG-TO-DIGITAL CONVERTERS

TECHNICAL FIELD

This technical field relates to analog-to-digital conversion and related circuitry.

BACKGROUND

High-speed and high-accuracy analog-to-digital converters (ADCs) are used in many electronic architectures and solutions. For example, high-speed, high-accuracy ADCs are used in digitally modulated radar systems, communication systems, and other environments. Design of such ADCs is challenging due to speed and accuracy requirements particularly for low power solutions. Further, with semiconductor processing using 40 nanometer (nm) processes and below, the difficulty in designing of such ADCs increases significantly.

Typical designs that are high-speed (e.g., sample rates of 1 gigahertz (GHz) and above) use time-interleaved stages to obtain composite sample rates that achieve desired speeds and throughput. The use of these time-interleaved stages, however, is susceptible to errors in the sampling process, require tightly controlled clock skew between the time-interleaved stages, and often require tuned delays between interleaved paths. In addition to skew, gain and offset errors within the time-interleaved states introduce spurious, unwanted noise. The sampling process errors and gain/offset errors degrade the output spectrum of these prior time-interleaved ADC solutions. As such, the digital conversion provided by these prior time-interleaved ADC solutions can suffer from accuracy degradation that degrades overall system performance.

DESCRIPTION OF THE DRAWINGS

It is noted that the appended figures illustrate only example embodiments and are, therefore, not to be considered as limiting the scope of the present invention. Elements in the figures are illustrated for simplicity and clarity and have not necessarily been drawn to scale.

DETAILED DESCRIPTION

Figure 1:
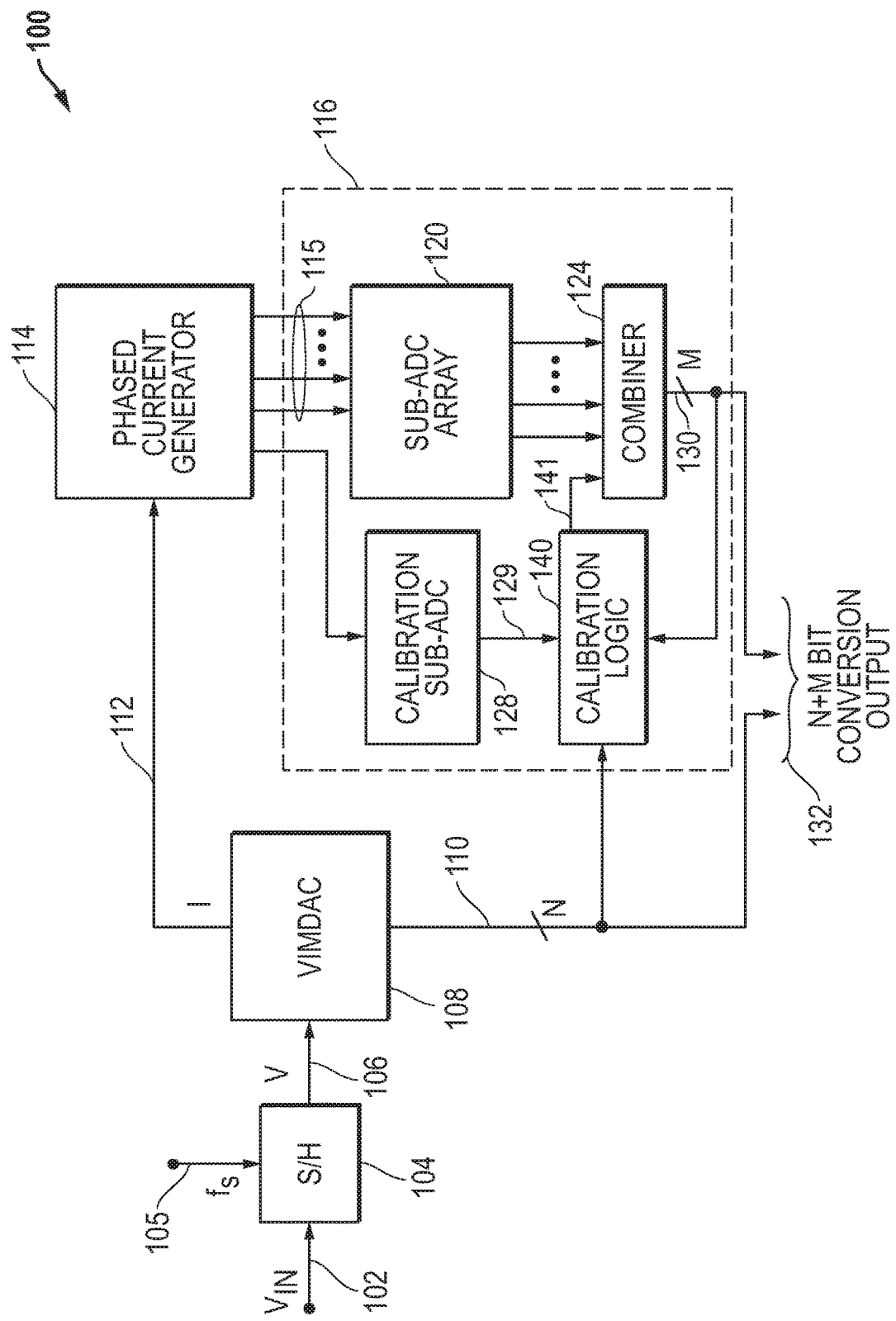
FIG. 1 is a block diagram of an example embodiment of an analog-to-digital converter (ADC) having a front-end multiplying digital-to-analog converter (MDAC) and an array of time-interleaved ICRO (current-controlled ring oscillator) sub-ADCs.

Systems and related methods are disclosed for MDAC-based time-interleaved analog-to-digital converters (ADCs) and related methods. For one embodiment, an MDAC (multiplying digital-to-analog converter) is used to convert an input voltage to a current and to generate an N-bit digital value that provides a most-significant-bit (MSB) portion of the digital conversion. This initial conversion reduces the resolution needed for the additional analog-to-digital conversion circuitry. The current from the MDAC is then sampled to generate time-interleaved currents that are provided to an array of ICRO (current-controlled ring oscillator) sub-ADCs that provide an additional M-bit digital value. This multi-stage conversion architecture provides efficiency and accuracy advantages over prior solutions that suffer from skew, gain and offset errors. For further embodiments, efficient calibration techniques are provided that rely upon the M-bit digital values and regions of operation determined by the N-bit digital values to generate calibration correction values. These calibration techniques provide further efficiency improvements. The embodiments described herein can be used in a wide range of environments including digitally modulated radar systems, vehicle networking, or other environments. A variety of features and variations can be implemented while taking advantage of the techniques described herein.

For the disclosed embodiments, the time-interleaved ADCs are based upon time-interleaved ICRO (current-controlled ring oscillator) sub-ADCs with a front-end MDAC stage. The front-end MDAC stage provides a portion of the digital conversion (e.g., N-bit) and an array of time-interleaved ICRO sub-ADCs provide the remaining portion of the digital conversion (e.g., M-bit). In part, the disclosed embodiments provide one or more of the following features or advantages:

current mode solution provides improved isolation;
current range is broken into smaller sections over which each of a plurality of ICRO sub-ADCs operate thereby improving linearity;

initial N-bit conversion is provided by the MDAC (e.g., 2.5 bits) which reduces the linearity requirements for the array of ICRO sub-ADCs by N bits;

the front-end MDAC allows for simple calibration of non-linearities;

the outputs of the ICRO sub-ADCs are averaged to provide scalability and an easily implementable performance-versus-throughput trade-off in the sub-ADCs;

pseudo-differential embodiments can be implemented to provide additional improvements in resolution; and other features and advantages.

For one embodiment, the ADC circuitry can be implemented using FinFET (Fin Field Effect Transistor) processes and CMOS (Complementary Metal Oxide Semiconductor) design. Low power operation can be achieved at core voltages of 0.8 volts and below. Further, 16 nm FinFET technology can be used to manufacture integrated circuits implementing these time-interleaved ADCs. For one example embodiment, a time-interleaved ADC is disclosed that operates at four (4) gigahertz (GHz) or above while providing a digital conversion of ten (10) bits or above. Additional or different features and variations can also be implemented.

The disclosed embodiments will now be described in more detail with respect to the drawings. FIGS. 1-4 provide diagrams for an example embodiment of a time-interleaved ADC. FIGS. 5A-B provide example embodiments for Robertson diagrams that can be implemented by the MDACs described with herein. FIGS. 6-8 and 9A-B provide more detailed circuit diagrams and timing diagrams for an example embodiment of an MDAC and the generation of time-interleaved currents applied to an array of ICRO sub-ADCs. FIGS. 10A-B and 11A-B provide more detailed diagrams for an efficient calibration technique for multi-stage analog-to-digital converters. Additional or different embodiments can also be implemented.

Looking first to FIG. 1, a block diagram is provided of an example embodiment for an ADC 100 having a front-end MDAC 108, a phased current generator 114, and an array 120 of time-interleaved ICRO sub-ADCs. The ADC 100 receives an input signal ($V_{IN}$) 102 and outputs a digital conversion output 132 having N+M bits. For one embodiment, the input signal 102 is a high-frequency signal including one or more frequency components of 1 GHz or above, and the conversion digital output 132 is 10 bits or more. Variations can be implemented.

The input signal 102 is received by sample-and-hold (S/H) circuit 104. The S/H circuit 104 samples the input signal 102 with a sample clock 105 having a global sample rate ($f_S$) for the ADC 100. For one embodiment, the S/H circuit is implemented with capacitors coupled to switches for switched capacitor operation. The S/H circuit 104 helps to prevent skew-induced errors because only one sample clock 105 is used to sample the input signal 102 as opposed to multiple sample clocks in prior solutions. Subsequent time interleaving for embodiment 100, therefore, is not be affected by skew of this sample clock 105 because the input signal 102 has already been sampled. As shown further in FIG. 2, the sample-and-held output voltage (V) 106 can also be buffered before it is routed to the input of a linear voltage-to-current multiplying digital-to-analog converter (VIMDAC) 108.

The VIMDAC 108 provides an output current (I) 112 and the first N bits of the digital conversion output 132 provided by ADC 100. As described in more detail with respect to FIG. 3, the VIMDAC 108 first converts the output voltage (V) 106 from the S/H circuit 104 to the current domain and then converts this current to a residue output current (I) 112 that is provided to the phased current generator 114. The voltage to current relationship of the residue current 112 is determined by bits triggered within the VIMDAC 108, and the full-scale input range of the time-interleaved ADC circuit 116. The N-bit digital value 110 from the VIMDAC 108 provides the first N bits of the overall digital conversion output 132 for the ADC 100.

Phased current generator 114 receives output current (I) 112 from the VIMDAC 108 and outputs time-interleaved currents 115 to the array 120 of ICRO sub-ADCs within the time-interleaved ADC circuit 116. As described in more detail in FIG. 4, the current 112 is effectively sampled and held with an array of phased clock pulses and switch current circuits to generate the time-interleaved currents 115.

The phased copies of the current 112 are provided as time-interleaved currents 115 to the array 120 of ICRO sub-ADCs. As shown in more detail in FIG. 4, the separate ICRO sub-ADCs within array 120 receive these phased copies of the current 112 in a time-interleaved manner based upon phased clock pulses. The digital output values of each of the sub-ADCs are then averaged. The averaged digital output values are then combined together to form the M-bit digital value 130. This combined M-bit digital value 130 is then combined with the N-bit digital value 110 from the VIMDAC 108 to form the N+M-bit digital conversion output 132 for the ADC 100. As further described herein, nonlinearities and gain errors existing within the ADC signal path can be estimated and corrected in the digital domain through a calibration routine using a calibration sub-ADC 128 and calibration logic 140. The calibration sub-ADC 128 generates a calibration value 129 based upon the current 112. The calibration logic 140 then generates correction values 141 for the combiner 124 based upon this calibration value 129 and the N-bit digital value 110. In addition, as described in more detail with respect to FIGS. 10A-B, the calibration logic 140 can also operate without the calibration sub-ADC 128 to generate correction values 141 based upon the M-bit digital value 130 and the N-bit digital value 110. Other variations can also be implemented while still taking advantage of the techniques described herein.

Figure 2:
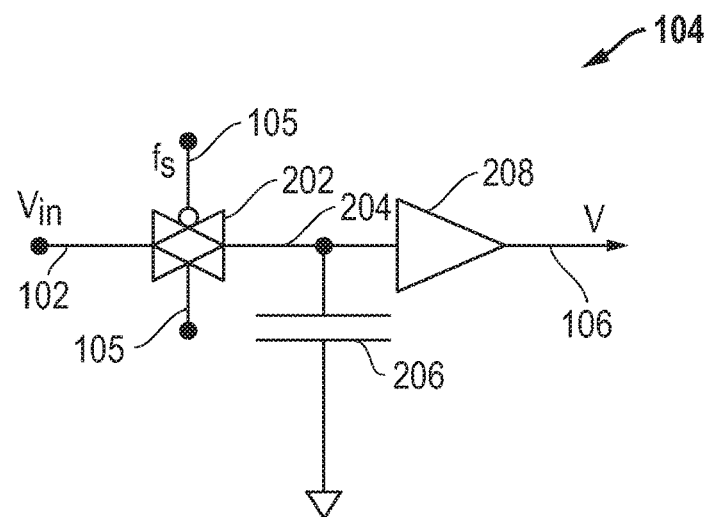
FIG. 2 is a circuit diagram of an example embodiment for sample-and-hold circuit of FIG. 1 that operates at a global sample rate ($f_S$).

FIG. 2 is a circuit diagram of an example embodiment for S/H circuit 104. The input signal ($V_{IN}$) 102 is coupled to transmission gate 202 that is controlled by the sample clock 105 to sample the input signal 102 at a global sample rate ($f_S$). For example, the transmission gate 202 can be a CMOS transmission gate including a PMOS (p-channel metal-oxide-semiconductor) transistor and an NMOS (p-channel metal-oxide-semiconductor) transistor controlled by the sample clock 105 and an inverted version of the sample clock 105. The gate of the NMOS transistor can be coupled to the sample clock 105, and the gate of the PMOS transistor can be computed to an inverted version of the sample clock 105. When the sample clock 105 is at a high logic level, the input signal 102 is transmitted by the transmission gate 202 to node 204. When the sample clock 105 is a low logic level, the input signal 102 is isolated from the node 204 by the transmission gate 202. The capacitance 206 coupled between node 204 and ground stores a voltage proportional to the amplitude of the input signal 102. This stored voltage is buffered by buffer 208, which can be a CMOS buffer, and the output voltage (V) 106 provides a sampled voltage at the global sample rate ($f_S$) based upon the sample clock 105.

Figure 3:
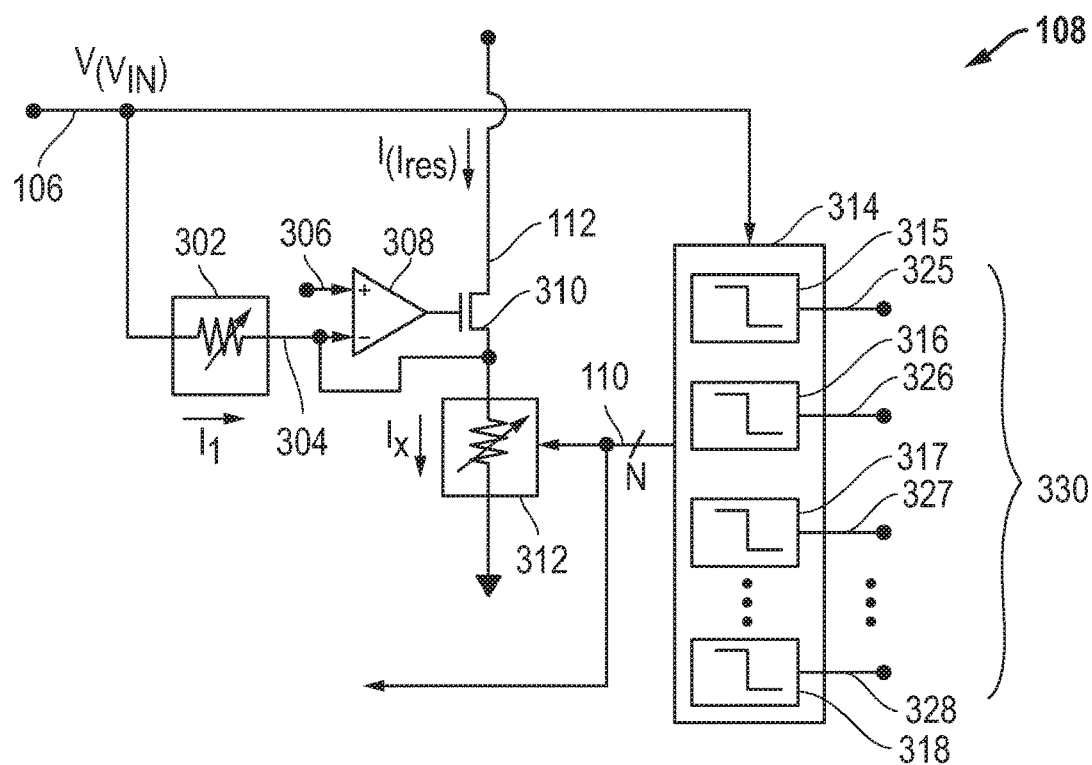
FIG. 3 is a circuit diagram of an example embodiment for the voltage-to-current multiplying digital-to-analog converter (VIMDAC) of FIG. 1 that generates a residue output current and an N-bit digital value, which is part of the overall digital conversion output.

FIG. 3 is a circuit diagram of an example embodiment for VIMDAC 108. The VIMDAC 108 receives the output voltage (V) 106 and generates the current (I) 112 and the N-bit digital value 110. For the embodiment shown, the output voltage 106 is received by an array 314 of different comparators 315, 316, 317 . . . 318, which compare the voltage 106 to different trip voltages 330. The trip voltages 330 include trip voltage levels 325, 326, 327 . . . 328 coupled to comparators 315, 316, 317 . . . 318, respectively. The outputs of these comparators 315, 316, 317 . . . 318 provide thermometer coded outputs that represent the N-bit digital value 110. For example embodiments below, N=3 and six (6) comparators are used to achieve 2.5 bits of resolution. The outputs of the comparators represent thermometer coded values that in turn represent binary values from 000 to 110. The following TABLE provides an example embodiment for relationships between these values where 2.5 bits of resolution are achieved.

TABLE

Thermometer Coding to Binary Relationships
(2.5 Bits of Resolution)

| Comparator Outputs (Thermometer Bits) | Binary (N-bit) | Decimal Value |
|---|---|---|
| 000000 | 000 | 0 |
| 000001 | 001 | 1 |
| 000011 | 010 | 2 |
| 000111 | 011 | 3 |
| 001111 | 100 | 4 |
| 011111 | 101 | 5 |
| 111111 | 110 | 6 |

Looking back to FIG. 3, comparator 315 compares the voltage 106 to trip voltage level 325 and provides the most significant thermometer coding value. Comparator 316 compares the voltage 106 to trip voltage level 326 and provides the next most significant thermometer coding value. Comparator 317 compares the voltage 106 to trip voltage level 327 and provides the next most significant thermometer coding value. This continues depending upon the number of bits selected for N and the resolution being achieved. The last comparator 318 compares the voltage 106 to trip voltage level 328 and provides the least significant thermometer coding value. The N-bit digital value 110 is a binary value based upon the thermometer coded value generated by the outputs of the comparators 315, 316, 317 . . . 318. The N-bit digital value 110 provides the first N-bits of the digital conversion output 132 provided by the ADC 100.

The N-bit digital value 110, for example, as represented by thermometer coded values output by comparators 315, 316, 317 . . . 318, is also used as a control word that is applied to the variable resistance circuit 312. For example, the variable resistance circuit 312 can be implemented as an array of resistor loads, with the array of resistor loads being enabled or disabled using switches controlled by the N-bit digital value 110. The variable resistance circuit 312 is coupled between the drain of NMOS transistor 310 and ground. The source for NMOS transistor 310 provides the current 112 to the phased current generator 114 as shown in FIG. 1. The gate for the NMOS transistor 310 is controlled by a differential amplifier 308. The differential amplifier 308 receives a common mode (CM) reference voltage 306 and a voltage input 304 from a variable tuning resistance 302. The variable tuning resistance 302 receives the voltage 106 and provides the voltage input 304 to the differential amplifier 308. The variable tuning resistance 302 can be implemented as a plurality of selectable resistors controlled by a digital input. The drain for NMOS transistor 310 is also coupled to the voltage input 304 for differential amplifier 308.

In operation, the output current 112 is dependent upon the variable resistance circuit 312 and the voltage 106, which is in turn dependent upon the amplitude of the input signal 102. The output current 112 is also dependent upon the N-bit digital value 110 (e.g., as represented by thermometer coded values output by comparators 315, 316, 317 . . . 318), which controls the variable resistance circuit 312. As described in more detail below, the resistance for the variable resistance circuit 312 is determined by the outputs from the comparators 315, 316, 317 . . . 318, and this variable resistance creates a current 112 that follows the voltage/current (V/I) equation for each region of the Robertson diagrams described below. The outputs from the comparators 315, 316, 317 . . . 318 effectively determine which region of the Robertson diagram is used, and the resistance is set based on the voltage-current (V/I) relationship for the region dictated by the comparator output word. The different regions for the Roberson diagrams represent different values for the N-bit digital value 110.

Figure 4:
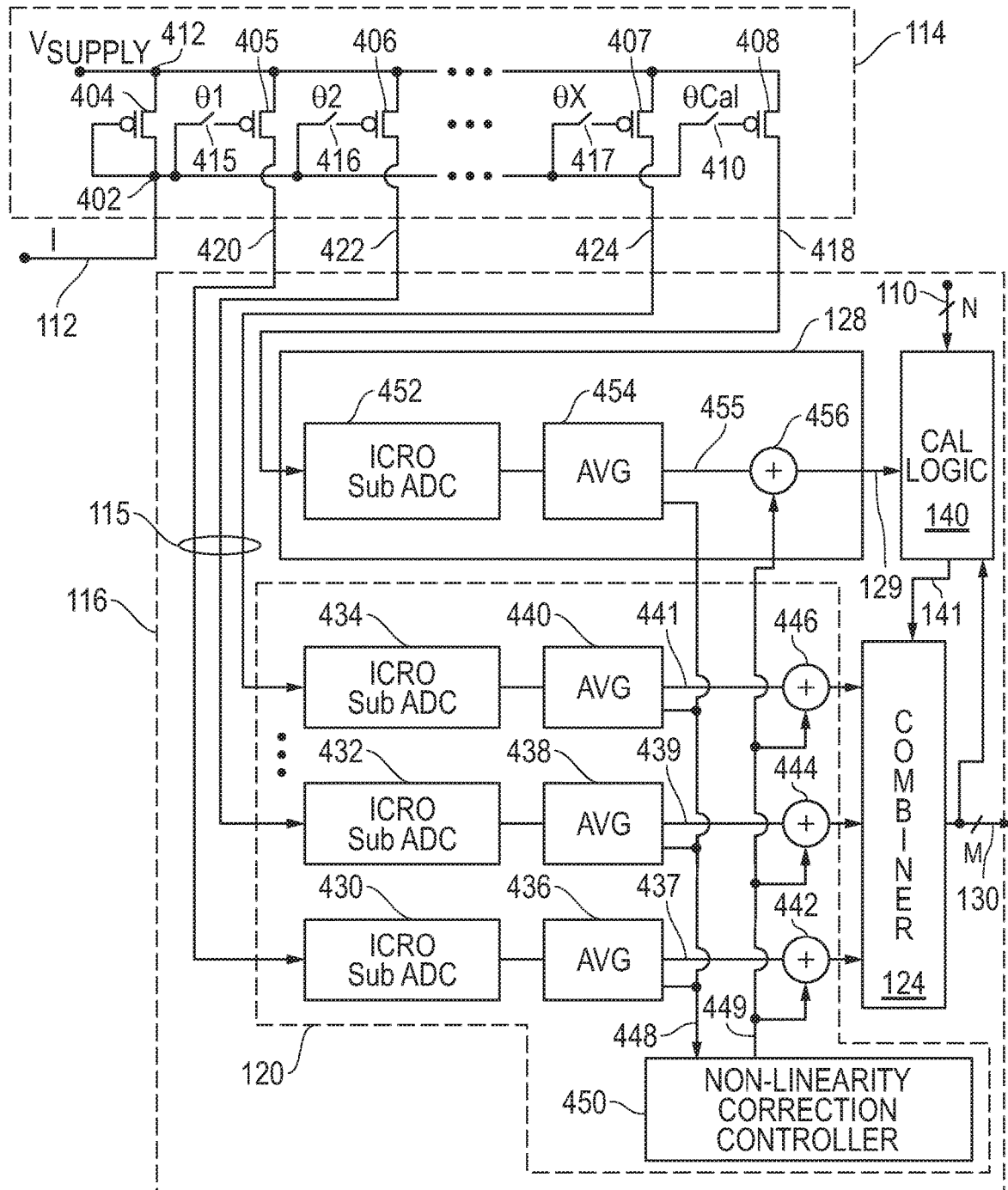
FIG. 4 is a circuit diagram of example embodiments for the phased current generator of FIG. 1, which outputs time-interleaved currents based upon the residue current, and for the time-interleaved ADC circuit of FIG. 1 that generates the M-bit digital value, which is part of the overall digital conversion output.
Figure 5A:
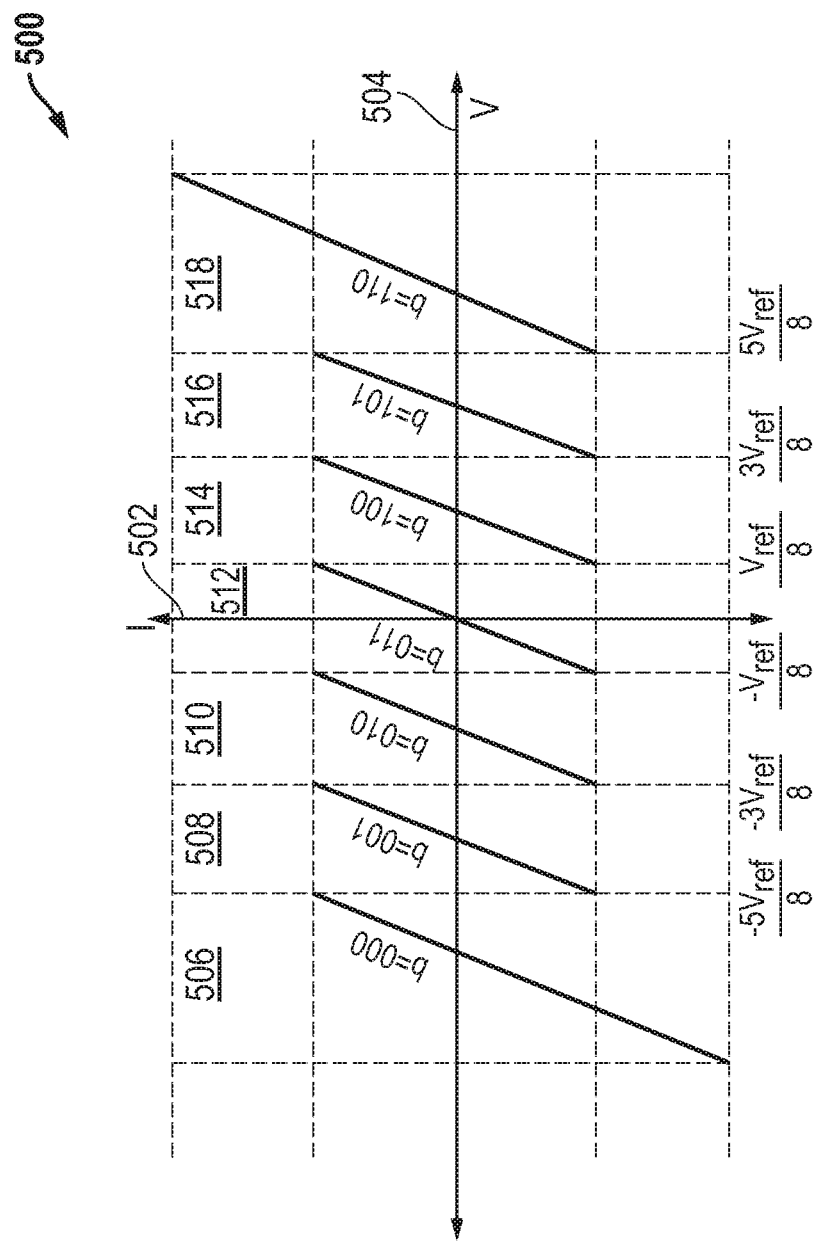
FIGS. 5A-B provides example embodiments for Robertson diagrams that are achieved by example implementations of the VIMDAC.
Figure 5B:
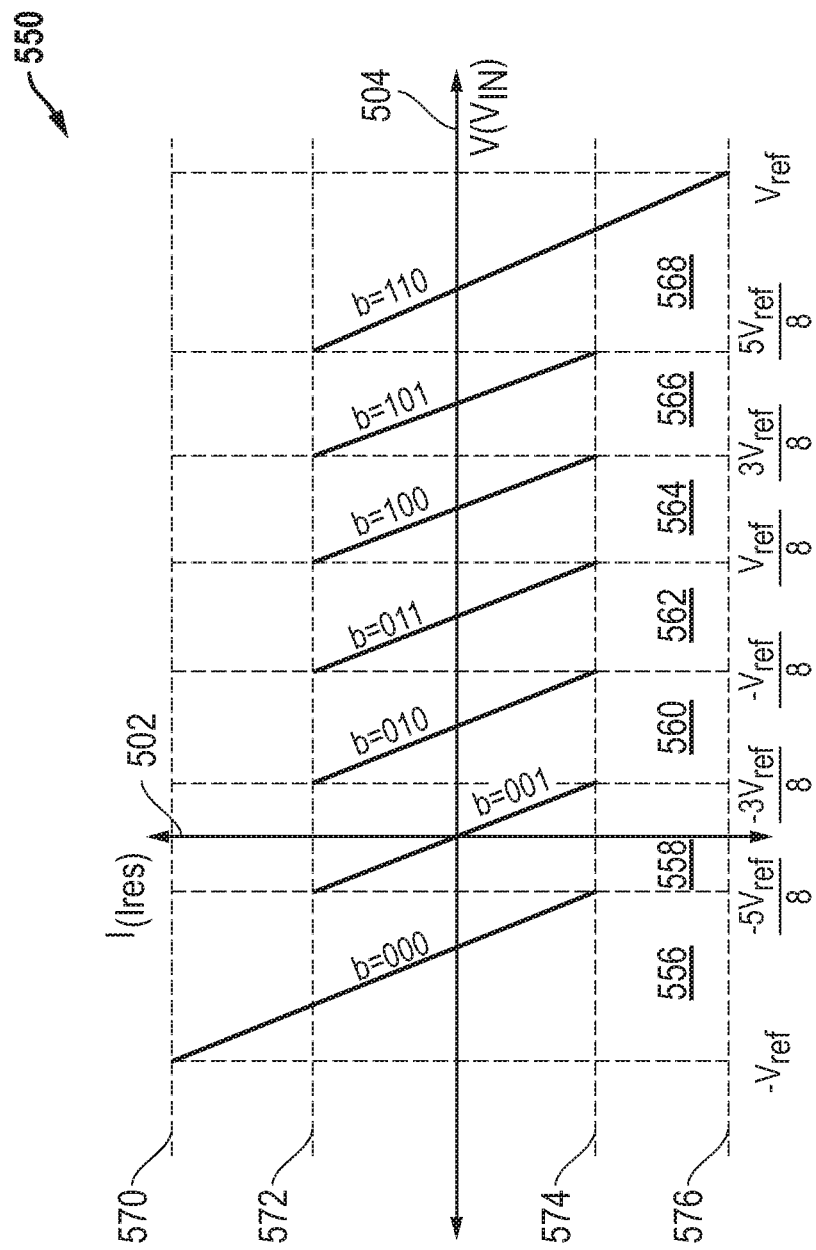

FIG. 4 is a circuit diagram of example embodiments for the phased current generator 114 and the time-interleaved ADC circuit 116 shown in FIG. 1. The output current (I) 112 is received by the phased current generator 114, and the phased current generator 114 provides time-interleaved currents 420, 422 . . . 424 that are copies of the current 112 to the time-interleaved ADC circuit 116. The time-interleaved ADC circuit 116 includes the array 120 of ICRO sub-ADCs that receive the time-interleaved currents 420, 422 . . . 424. The time-interleaved ADC circuit 116 outputs the M-bit digital value 130. It is noted that the example embodiment for the phase current generator 114 in FIG. 4 is implemented with PMOS transistors. The phase current generator 114 can also be implemented using NMOS transistors or a combination of PMOS and NMOS transistors. Other variations can also be implemented.

Looking in more detail to the phased current generator 114, the current 112 is coupled to node 402. Node 402 is coupled to the drain and gate of PMOS transistor 404 so that PMOS transistor 404 operates as a diode-connected device within a current mirror. The source of PMOS transistor 404 is coupled to node 412, and node 412 is coupled to a supply voltage ($V_{SUPPLY}$). The sources of PMOS transistors 405, 406 . . . 407, 408 are also coupled to node 412 and the supply voltage. The drains of PMOS transistors 405, 406 . . . 407, 408 are coupled to provide the time-interleaved currents 420, 422 . . . 424 to the time-interleaved ADC circuit 116. The gates of PMOS transistors 405, 406 . . . 407, 408 are coupled to node 402 through switches 415, 416 . . . 417, 418. These switches 415, 416 . . . 417, 418 are controlled by time-interleaved phased clock pulses θ1, θ2 . . . θX, θCal. When turned "ON," these switches 415, 416 . . . 417, 418 connect the gates to node 402 thereby turning "ON" the PMOS transistors 405, 406 . . . 407, 408. When "ON," the PMOS transistors 405, 406 . . . 407, 408 operate as current mirrors with respect to PMOS transistor 404 and generate copies of the current 112 on their respect drains. As such, PMOS transistors 405, 406 . . . 407 and time-interleaved phased clock pulses θ1, θ2 . . . θX (i.e., X different phased clock pulses) are used to provide copies of the current 112 as time-interleaved currents 420, 422 . . . 424 to the array 120 of ICRO sub-ADCs. The PMOS transistor 408 and phased clock pulse θCal are used in a calibration mode to provide current 418 to the calibration sub-ADC 128.

Looking to the time-interleaved ADC circuit 116, the ICRO sub-ADCs 430, 432 . . . 434 receive the phased clock pulses θ1, θ2 . . . θX as phase-sampled versions of the residue output current (I) 112 from the VIMDAC 108. In effect, each of these sub-ADCs 430, 432 . . . 434 use sample-and-held and current-converted versions of the input signal 102 at distinct phase relations to the original signal. The digital values output from the sub-ADCS 430, 432 . . . 434 are then provided to averaging circuits 436, 438 . . . 440, respectively. For example, the averaging circuits 436, 438 . . . 440 can include logic circuits and registers that accumulate digital values from sub-ADCs 430, 432 . . . 434 and average these digital values over a selected time period to provide averaged digital output values 437, 439 . . . 441 to the combiner 124. This time period is dependent on the global ADC sample rate ($f_S$), the sample rate selected for the sub-ADCs, and the number of channels (i.e., X different sub-ADCs) in the time-interleaved sub-ADC array 120. Each of the averaged digital output values 437, 439 . . . 441, for example, can provide M/X bits of the combined M-bit digital value 130 output by combiner 124.

The calibration sub-ADC 128 can be used to calibrate operation of the sub-ADCs 436, 438 . . . 440. During calibration mode, a copy of the current 112 is provided through PMOS transistor 408 as calibration current 418 to the ICRO sub-ADC 452 within the calibration sub-ADC 128. The averaging circuit 454 receives the digital values output from the ICRO sub-ADC 452 and provides an averaged digital value 455 to adder 456. A digital calibration value 129 is then output to calibration (CAL) logic 140. The calibration logic 140 can also receive the N-bit digital value 110 and the M-bit digital value 130. During calibration mode, the calibration logic 140 compares this digital calibration value 129 to expected values and generates digital correction values 141. The digital correction values 141 are provided to combiner 124 so that calibration adjustments can be made.

Figure 10A:
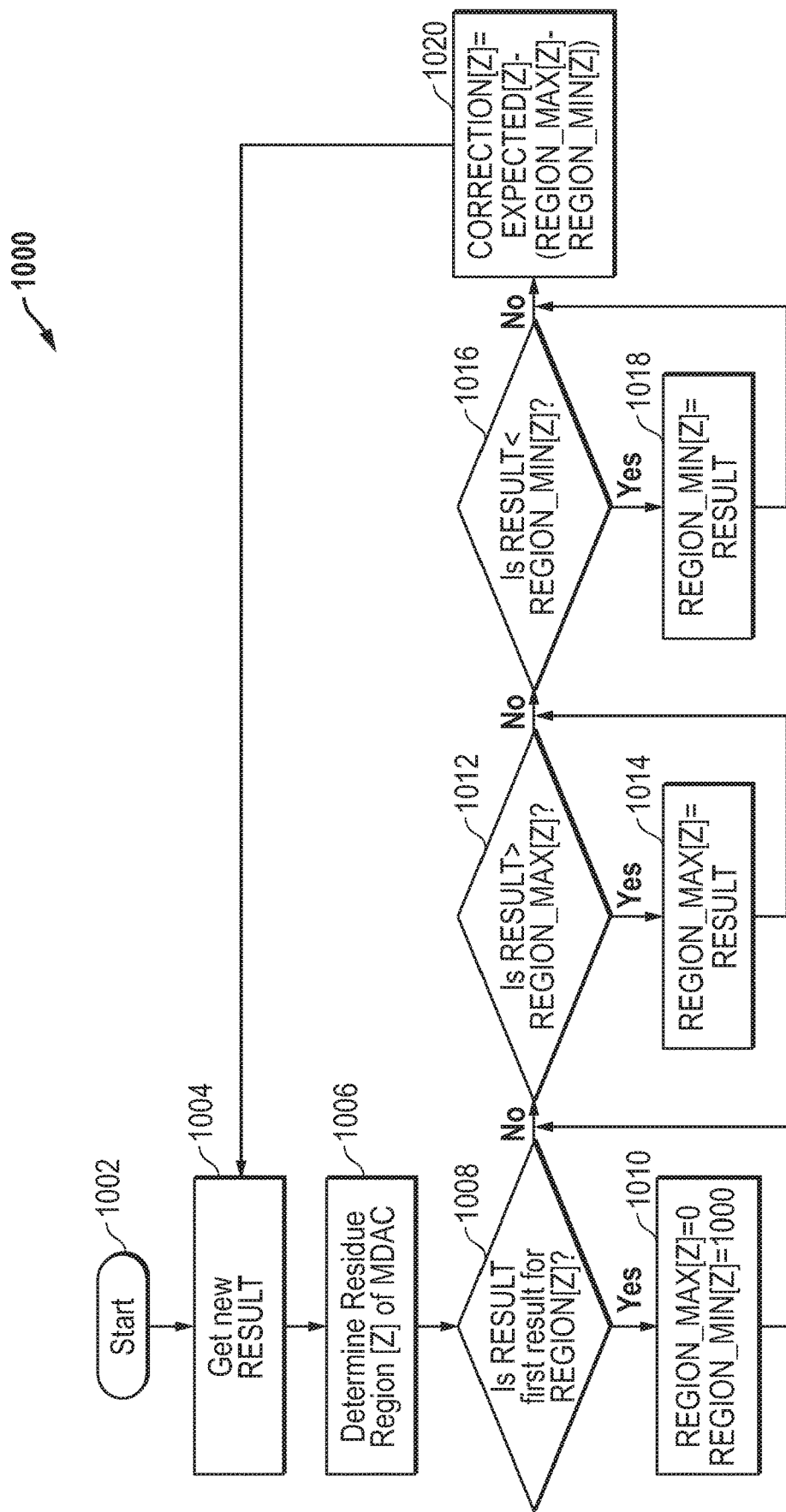
FIG. 10A is a flow diagram of an example embodiment for a calibration process that can be performed by calibration logic for the multi-stage analog-to-digital converter embodiments described herein.
Figure 10B:
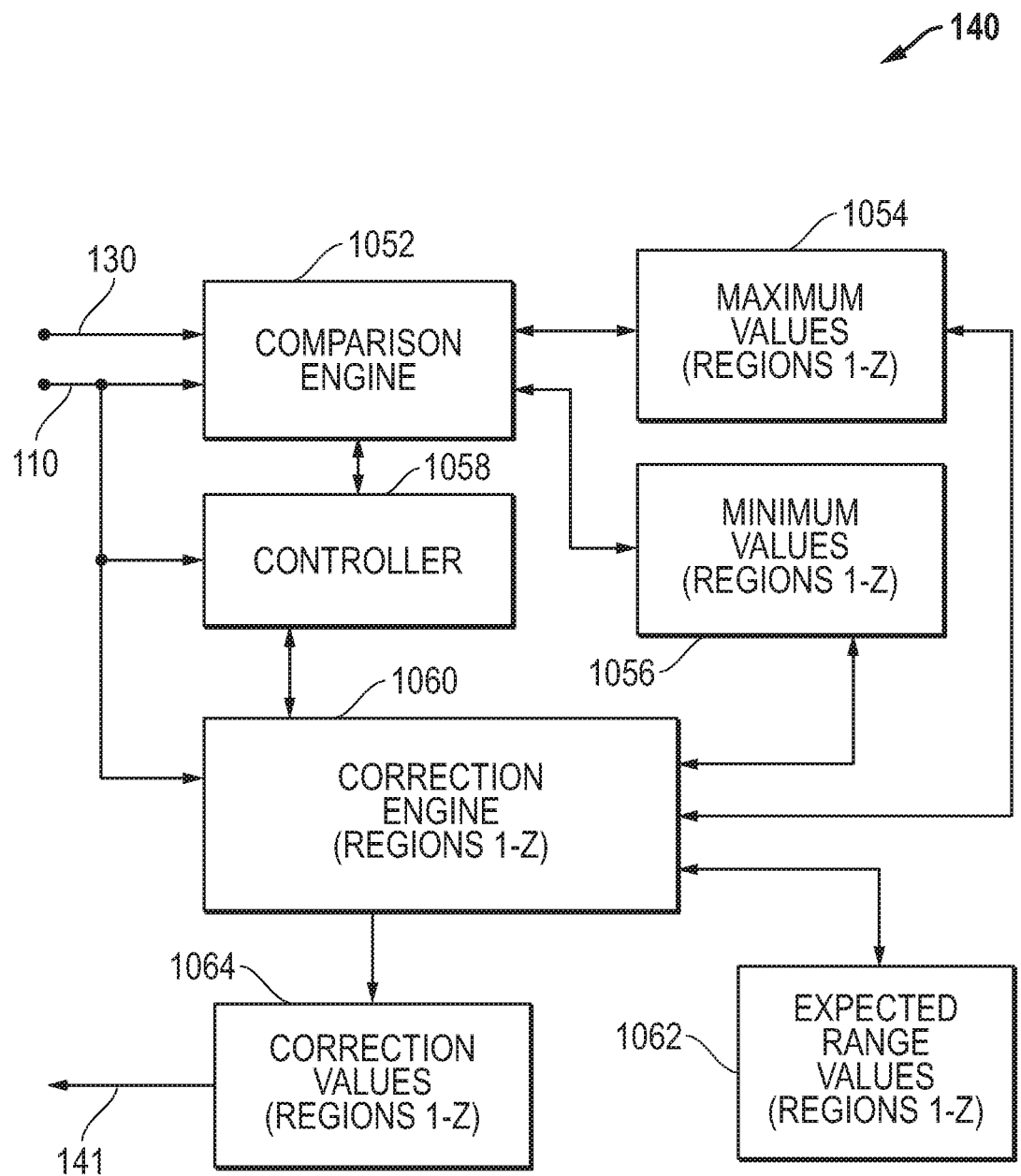
FIG. 10B is a block diagram of an example embodiment for calibration logic to implement the calibration process of FIG. 10A.

The calibration logic 140 logic can also operate without the calibration sub-ADC 128 to generate calibration correction values 141 as described in more detail with respect to FIGS. 10A-B. For this calibration embodiment, the calibration logic 140 determines calibration correction values 141 for the different regions of operation for the VIMDAC 108. As described in more detail below, the calibration logic 140 determines the region of operation from the N-bit digital value 110, and then tracks maximum and minimum values for the M-bit digital value 130 within these different regions. Calibration correction values 141 for each operational region are then generated based upon differences between these maximum and minimum values.

As also shown in FIG. 4, non-linearity corrections can be used to adjust the operation of the time-interleaved ADC circuit 116 through adders 442, 444 . . . 446, 456 coupled between the averaging circuits 436, 438 . . . 440, 454 and the combiner 124. A bus 448 can provide outputs from the ICRO sub-ADCs 436, 438 . . . 440, 452 to a non-linearity correction controller 450. The controller 450 processes these outputs, for example, by comparing them to desired operational parameters, and generates corrections to be applied as correction factors. These corrections can be applied through bus 449 to adders 442, 444 . . . 446, 456 in order to adjust the averaged digital values 437, 439 . . . 441, 455 before they are provided to combiner 124. The corrections can be, for example, positive or negative digital values that are added to the averaged digital values 437, 439 . . . 441, 455. Different corrections can also be generated and provided to each of the adders 442, 444 . . . 446, 456. The calibration adjustments, such as through calibration correction values 141, can also be applied through the operation of non-linearity correction controller 450. As such, the averaged digital values 437, 439 . . . 441, 455 are adjusted to correct for nonlinearities and gain errors that are present along the signal conversion path.

The ICRO sub-ADCs 430, 432 . . . 434, 452 can be implemented as current-starved ring oscillators that operate as a first-order sigma-delta ADCs and sample at a rate independent of the global sample rate ($f_S$) for sampling clock 105. U.S. Pat. No. 8,542,138 provides example embodiments for current-controlled ring oscillators (ICROs) and related circuitry for high-speed ADC architectures that can be used for the disclosed embodiments. The ICRO ADCs described therein work on the principle that the frequency of the ring oscillator can be directly related to the input voltage of the signal being converted. The digital presentation of the input voltage applied is acquired by phase decoding the various phases of the ring oscillator to an equivalent digital code that relates the input voltage to an output decoded phase. This phase is then differentiated digitally in order to attain a representation of the ICRO frequency. The ring oscillator is a current driven, current starved oscillator and thus the correlation to the input is achieved by running the signal through a transconductance operation. U.S. Pat. No. 8,542,138 is hereby incorporated by reference in its entirety.

For one embodiment, the ICRO sub-ADCs 430, 432 . . . 434, 452 have a sample rate of 1 GHz or above. For another embodiment, the sample rate is 4 GHz or above. Different sample rates could also be used including lower frequency sample rates. It is noted that a sample rate for the sub-ADCs 430, 432 . . . 434, 452 is preferably greater than the global sample rate ($f_S$) for the ADC 100 based upon the global sampling clock 105 because this allows the selected time period for averaging to be adjusted. For example, increased averaging within the averaging circuits 436, 438 . . . 440, 454 can be implemented by increasing the selected time period. This increased averaging of each time-interleaved current 420, 422 . . . 424 provides additional accuracy in the digital implementation of the averaged value. This adjustment in sample rates can be accomplished in part, for example, by reducing the number of stages in ring oscillators used within the ICRO sub-ADCs 430, 432 . . . 434, 452. For one embodiment, a 62-stage ring oscillator that runs at a sample rate of 1 GHz is used for each of the ICRO sub-ADCs 430, 432 . . . 434, 452. For one further embodiment, a sample rate of 4 GHz is achieved using 14 stages (i.e., dropped by a factor of 4). One advantage of this is reduction in stages is that the digital overhead in terms of die area and complexity is reduced by 4-times. One disadvantage of this reduction in stages is that the digital logic must now run at a higher rate of 4 GHz, which is more difficult to achieve. However, 16 nm FinFET processes or other advanced semiconductor processing can be used to achieve these sample rates of 4 GHz or above.

During operations, the ICRO sub-ADCs 430, 432 . . . 434 are not susceptible to timing skews and inaccuracies in the time-interleaved channels provided by the ICRO sub-ADCs 430, 432 . . . 434 because the global sample-and-hold provided by S/H circuit 104 removes the need for sampling at each of the ICRO sub-ADCs 430, 432 . . . 434. In addition, using a redundant signed-digit topology in the VIMDAC 108 as shown in FIG. 3, a simple calibration algorithm can be implemented in the digital domain to correct for non-linearities and gain errors. Other advantages can also be achieved.

As further shown in FIG. 3, the sample-and-held output voltage (V) 106 is converted to a current through the resistor-based linear VIMDAC circuit 108. The resulting residue current (I) 112 from the VIMDAC 108 is subsequently sampled-and-held with an array of switch circuits 415, 416 ... 417 as shown in FIG. 4. For one embodiment, this sampling by the phased clock pulses θ1, θ2 ... θX occurs at an update rate of $f_S/16=250$ Mhz where $f_S$ is 4 GHz. For one further embodiment, the global sample rate ($f_S$) is 4 GHz, and sixteen (16) sub-ADCs are used in the array 120. It is again noted that the number of interleaved sub-ADCs is completely flexible as well as the sample rate for the sub-ADCs. Therefore, the update rate for the time-interleaved residue currents 420, 422 ... 424 is not limited to a specific value and will change based on selected sample rate and accuracy desired for ADC 100. Furthermore, where the converted digital values 437, 439 ... 441 from the sub-ADCS 430, 432 ... 434 are averaged to generate averaged digital values 437, 439 ... 441, there is significant flexibility to increase the averaging at the cost of reduced throughput to further improve accuracy of the sub-ADCs 430, 432 ... 434. Additional variations can also be made while still taking advantage of the techniques described herein.

FIG. 5A provides an example embodiment 500 for a Robertson diagram that is achieved by one example implementation of the VIMDAC 108. Robertson diagrams are diagrams used to represent redundant signed-digit topologies typically found in switch-capacitor Nyquist ADCs. For embodiment 500, the vertical axis 502 represents the residue output current (I) 112, and the horizontal axis represents the sample-and-held voltage output (V) 106 with respect to the VIMDAC 108 of FIG. 3. A nominal reference voltage (Vref) is used to generate the different trip voltage levels 325, 326, 327 ... 328 for the comparators 315, 316, 317 ... 318 for array 114 shown in FIG. 3. In particular, six (6) different trip voltage levels 325, 326, 327 ... 328 are provided: −5Vref/8, −3Vref/8, −Vref/8, Vref/8, 3Vref/8, and 5Vref/8. The middle voltage (VMID) is set to Vref. These trip voltage levels provide different output regions for the output current 112 as shown. In particular, a first region 506 represents a 3-bit binary (b) output of 000. The next region 508 represents a binary output of 001. The next region 510 represents a binary output of 010. The next region 512 represents a binary output of 011. The next region 514 represents a binary output of 100. The next region 516 represents a binary output of 101. The last region 518 represents a binary output of 110. It is noted that the different trip voltage levels 325, 326, 327 ... 328 are referenced to Vref for this embodiment such that their values referenced to ground are Vref−5Vref/8, Vref−3Vref/8, Vref−Vref/8, Vref+Vref/8, Vref+3Vref/8, and Vref+5Vref/8.

For one embodiment, a fully differential solution is implemented using the embodiment 500. For both pseudo-differential paths, the resulting output current range causes the subsequent ICRO sub-ADC(s) to oscillate in the frequency ranges from $0.5*f_S$ to $1.5*f_S$. This is accomplished in part by providing a two-times (2×) gain in the VIMDAC 108 through the differential amplifier 308. While this gain increase would ideally translate to a 6 dB improvement in the signal-to-noise ratio, with separate ICRO sub-ADCs having uncorrelated quantization noise, the improvement is reduced. For example, with two separate ICRO sub-ADCs the improvement translates to only a 3 dB improvement for the 2× gain in the VIMDAC 108.

FIG. 5B provides an additional example embodiment 550 for a Robertson diagram that is achieved by another implementation of the VIMDAC. For embodiment 550, the vertical axis 502 represents the residue output current (I) 112, and the horizontal axis represents the sample-and-held voltage output (V) 106 with respect to the VIMDAC 108 of FIG. 3. A nominal reference voltage (Vref) is again used to generate the different trip voltage levels 325, 326, 327 ... 328 for the comparators 315, 316, 317 ... 318 for array 114 shown in FIG. 3. In particular, six (6) different trip voltage levels 325, 326, 327 ... 328 are provided: −5Vref/8, −3Vref/8, −Vref/8, Vref/8, 3Vref/8, and 5Vref/8. The middle voltage (VMID) is set to −4Vref/8. These trip voltage levels provide different output regions for the output current 112 as shown. In particular, a first region 556 represents a 3-bit binary (b) output of 000. The next region 558 represents a binary output of 001. The next region 560 represents a binary output of 010. The next region 562 represents a binary output of 011. The next region 564 represents a binary output of 100. The next region 566 represents a binary output of 101. The last region 568 represents a binary output of 110. It is noted that the different trip voltage levels 325, 326, 327 ... 328 are referenced to Vref for this embodiment such that their values referenced to ground are Vref−5Vref/8, Vref−3Vref/8, Vref−Vref/8, Vref+Vref/8, Vref+3Vref/8, and Vref+5Vref/8.

With respect to the current levels, region 556 has a current range from current level 570 to current level 574. Regions 558, 560, 562, 564, and 566 have a current range from current level 572 to current level 574. Region 568 has a current range from current level 572 to current level 576. For one embodiment associated with the equations derived below, current level 570 is represented by the equation: Ires=Ic+Ic/2. Current level 572 is represented by the equation: Ires=Ic+Ic/4. Current level 574 is represented by the equation: Ires=−(Ic+Ic/4). Current level 576 is represented by the equation: Ires=−(Ic+Ic/2). When the N-bit digital value 110 is "000" in operational region 556, the output current is represented by the equation: Ires=(3*Ic/2)−(M*Vin). When the N-bit digital value 110 is "001" in operational region 558, the output current is represented by the equation: Ires=(4*Ic/2)−(M*Vin). When the N-bit digital value 110 is "010" in operational region 560, the output current is represented by the equation: Ires=(5*Ic/2)−(M*Vin). When the N-bit digital value 110 is "011" in operational region 562, the output current is represented by the equation: Ires=(6*Ic/2)−(M*Vin). When the N-bit digital value 110 is "100" in operational region 564, the output current is represented by the equation: Ires=(7*Ic/2)−(M*Vin). When the N-bit digital value 110 is "101" in operational region 566, the output current is represented by the equation: Ires=(8*Ic/2)−(M*Vin). When the N-bit digital value 110 is "110" in operational region 568, the output current is represented by the equation: Ires=(9*Ic/2)−(M*Vin). It is noted that the vertical axis 502 is placed where Vin=−4*Vref/8 and that the horizontal axis 504 is placed where Ires=Ic. Further, it is noted that "M" represents the slope of the lines and that "Ic" represents the center current for the ICRO sub-ADCs 430, 432 ... 434. For one embodiment, the slope is four (e.g., M=4). Other variations and Robertson diagrams can also be implemented while still taking advantage of the techniques described herein.

Looking now to FIGS. 6, 7, 8, and 9A-B, circuit and timing diagrams are provided of an example differential embodiment for VIMDAC 108 and phased current generator 114. This example embodiment can be used in an implementation operating at a high frequency, such as 4 GHz, and providing 10-bit resolution using a core supply voltage of one volt or below. This example embodiment is scalable to higher bit resolutions along with an increase in the number of comparators being used. Further, the accuracy of the comparators can be adjusted based upon the number of comparators being used and related trip points for the different operating regions.

As described in further detail below, the example embodiment provides a 2.5 bit VIMDAC including six (6) comparators operating at a sample rate of 4 GHz. A resistor array controlled with switches coupled to the comparator outputs is implemented for the variable resistance circuit 312 and sets the residue current 112. The operation of this switched resistor array as the variable resistance circuit 312 thereby sets the center current for the array of sub-ADCs 120 to the residue current 112 based upon the digital value 110, which is 6 bits for this example embodiment. The variable resistance circuit 312 essentially operates as a digital-to-analog converter (DAC). The internal transistor amplifier 310 provides a summing junction for the resistor array, sums current from the resistor array, and provides the residue current 112 to the phased current generator 114. A sample-and-hold switched current mirror circuit is used as the phased current generator 114 to create phased sample-and-held copies (θ1, θ2 . . . θX) of the residue current 112 that are sent to the time-interleaved ADC circuit 116.

The goal of this differential embodiment is to provide a VIMDAC that implements a current-mode implementation of the modified Robertson diagram as shown in FIG. 5B. As such, the scaled and sample-and-held phased versions of the residue current 112 are output to the array 120 of time-interleaved sub-ADCs. In FIGS. 5A-5B, output current is the dependent variable, and input voltage is the independent variable. A set of input-voltage-dependent residue current copies 115 are generated that enable the follow-on ICRO sub-ADCs to vary from $0.5*F_S$ to $1.5*F_S$. This variation in current translates to $0.5*Ic$ to $1.5*Ic$ (i.e., $Ic \pm Ic/2$) where Ic is the center-current for the ICRO sub-ADCs. The center-current is the input current that allows the ring-oscillator within the ICRO sub-ADC to oscillate at the same frequency as the sampling frequency for the ICRO sub-ADC. A differential solution is shown, and the voltage 106 received by the VIMDAC 108 is converted to a residue current 112 to create the required sampled-and-held copies 115 of the residue current 112 to control the array 120 of ICRO sub-ADCs. It is further noted that additional features and variations could also be implemented while still taking advantage of the techniques described herein.

Figure 6:
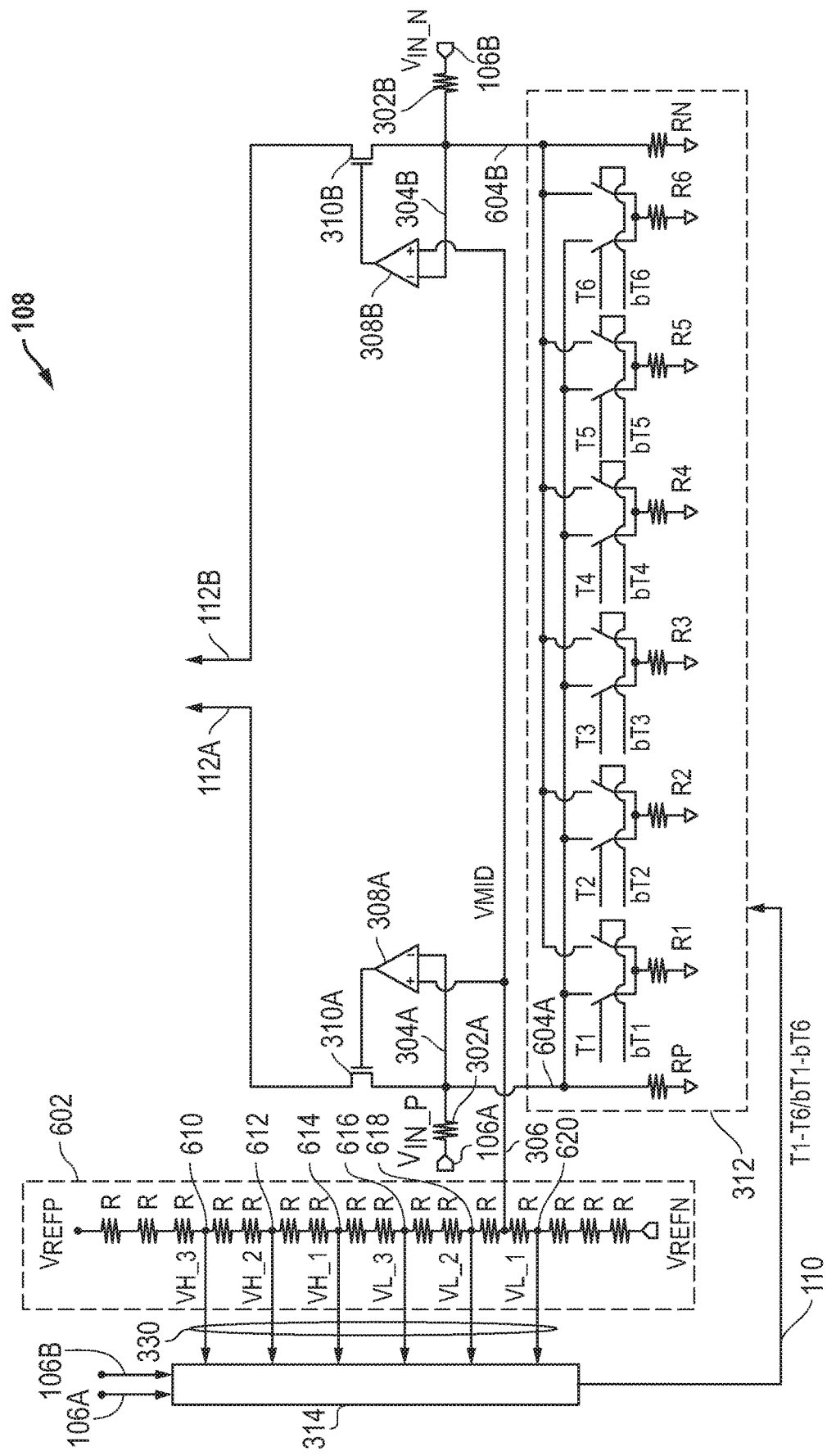
FIG. 6 is a circuit diagram of an example differential embodiment for the current controlled MDAC (VIMDAC) of FIG. 1 and FIG. 3.

Looking now to FIG. 6, a circuit diagram is provided of an example differential embodiment for VIMDAC 108. The VIMDAC 108 receives the voltage (V) 106 as a positive input voltage (VIN_P) 106A and a negative input voltage (VIN_N) 106B. The VIMDAC 108 generates the output residue current (I) 112 as differential outputs 112A and 112B. The N-bit digital value 110 from comparator array 314 is used as a control word that is applied to the variable resistance circuit 312. For this embodiment, the N-bit digital value 110 is a 6-bit digital value that is provided to the variable resistance circuit 312 as thermometer bits (T1-T6) and an inverse version of these thermometer bits (bT1-bT6). The variable resistance circuit 312 is implemented as an array of resistor loads (R1-R6), and the resistor loads (R1-R6) are enabled or disabled using switches controlled by the thermometer bits (T1-T6) and inverse thermometer bits (bT1-bT6). A positive-side resistor (RP) and a negative-side resistor (RN) are always enabled within the resistor array. The variable resistance circuit 312 has a positive-side output 604A and a negative-side output 604B. The array of resistor loads (R1-R6) are coupled between ground and outputs 604A/604B depending upon the state of switches as controlled by the thermometer bits (T1-T6) and inverse thermometer bits (bT1-bT6). As such, a variable resistance load is provided based upon the digital value 110.

The positive-side NMOS transistor 310A has its drain coupled to the positive-side output 604A from the variable resistance circuit 312. The source for NMOS transistor 310A provides the positive-side residue current 112A that is output to the phased current generator 114. The gate for the NMOS transistor 310A is controlled by positive-side differential amplifier 308A. The positive-side differential amplifier 308A receives the common mode (CM) reference voltage 306A and the positive-side voltage 106A through a variable tuning resistance 302A. The variable tuning resistance 302A can be implemented as a plurality of selectable resistors controlled by a digital input or as a fixed input resistance if desired. The drain of transistor 310A is also coupled to the output 304A of the variable tuning resistance 302A and the input of the positive-side differential amplifier 308A.

The negative-side NMOS transistor 310B has its drain coupled to the negative-side output 604B from the variable resistance circuit 312. The source for NMOS transistor 310B provides the negative-side residue current 112B that is output to the phased current generator 114. The gate for the NMOS transistor 310B is controlled by negative-side differential amplifier 308B. The negative-side differential amplifier 308B receives the common mode (CM) reference voltage 306B and the negative-side voltage 106B through a variable tuning resistance 302B. The variable tuning resistance 302B can be implemented as a plurality of selectable resistors controlled by a digital input or as a fixed input resistance if desired. The drain of transistor 310B is also coupled to the output 304B of the variable tuning resistance 302B and the input of the negative-side differential amplifier 308B.

For the example embodiment depicted, trip voltages 330 are generated within a resistor tree 602. The resistor tree 602 includes a plurality of resistors coupled in series between a positive reference voltage (VREFP) and a negative reference voltage (VREFN). For this example embodiment, six (6) trip voltages 330 are generated from intervening nodes 610, 612, 614, 616, 618, and 620. In addition, for this example embodiment, two resistors (R) are coupled between each of these nodes, and three resistors (R) are coupled between nodes 610/620 and the reference voltages (VREFP and VREFN), respectively. Node 610 provides high trip voltage VH_3. Node 612 provides high trip voltage VH_2. Node 614 provides high trip voltage VH_1. Node 616 provides low trip voltage VL_3. Node 618 provides low trip voltage VL_2. Node 620 provides low trip voltage VL_1. The different trip voltages 330 are coupled to comparator array 314, which also receives the voltages 106A/106B. The comparator array 314 outputs thermometer bits (T1-T6) and inverse thermometer bits (bT1-bT6) as digital value 110.

Figure 7:
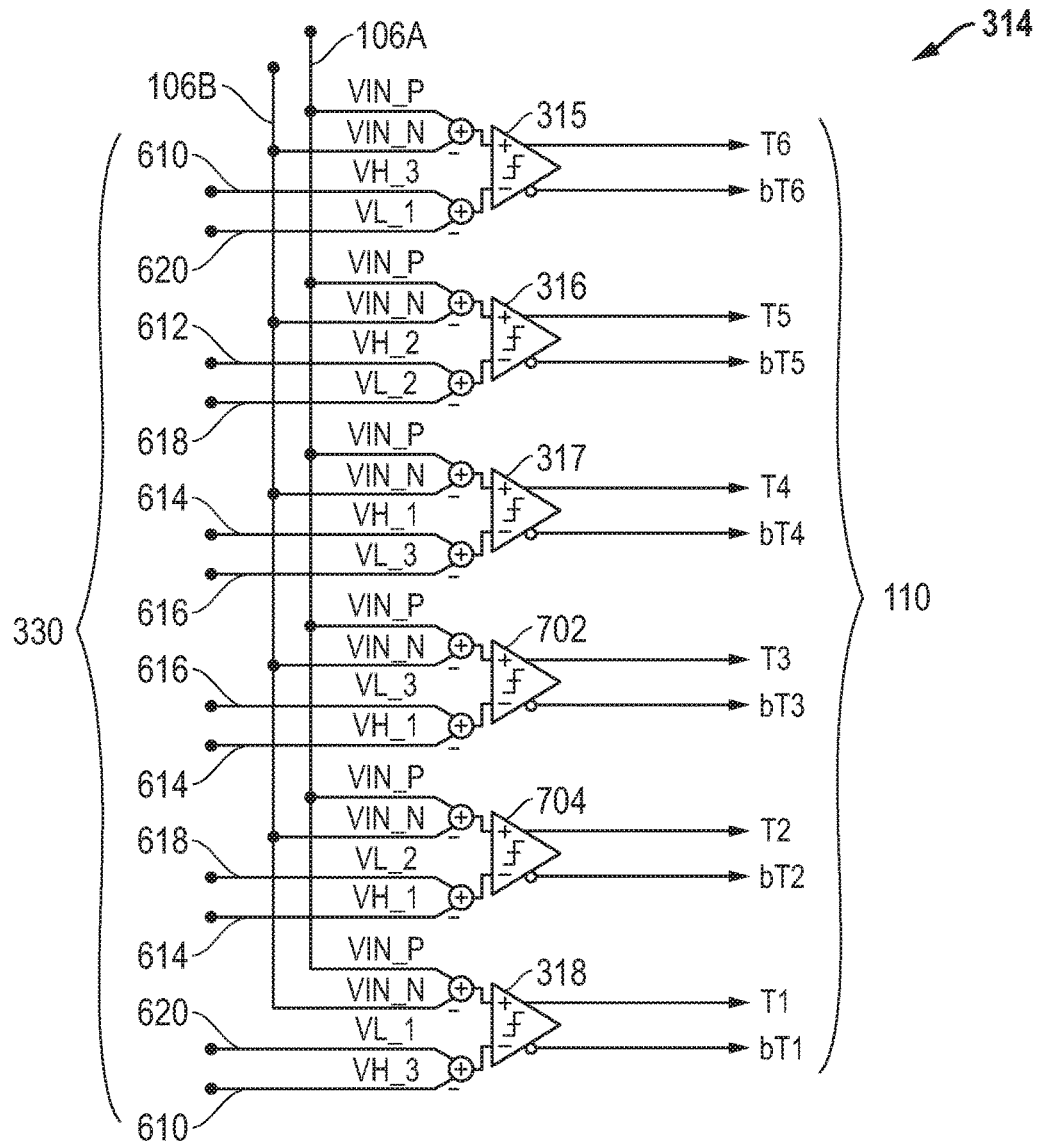
FIG. 7 is a circuit diagram of an example differential embodiment for the comparator array that receives the different trip voltages for the embodiment of FIG. 6.

FIG. 7 is a circuit diagram of an example differential embodiment for the comparator array 314 that receives the different trip voltages 330 for the embodiment of FIG. 6. A difference voltage based upon the positive-side voltage (VIN_P) 106A and negative-side voltage (VIN_N) 106B is coupled to the positive input (+) for comparators 315, 316, 317, 702, 704, and 318. For comparator 315, a difference voltage based upon trip voltage (VH_3) 610 and trip voltage (VL_1) 620 is coupled to the negative input (−) for comparator 315. For comparator 316, a difference voltage based upon trip voltage (VH_2) 612 and trip voltage (VL_2) 618 is coupled to the negative input (−) for comparator 316. For comparator 317, a difference voltage based upon trip voltage (VH_1) 614 and trip voltage (VL_3) 616 is coupled to the negative input (−) for comparator 317. For comparator 702, a difference voltage based upon trip voltage (VL_3) 616 and trip voltage (VH_1) 614 is coupled to the negative input (−)

for comparator 702. For comparator 704, a difference voltage based upon trip voltage (VL_2) 618 and trip voltage (VH_1) 614 is coupled to the negative input (−) for comparator 704. For comparator 318, a difference voltage based upon trip voltage (VL_1) 620 and trip voltage (VH_3) 610 is coupled to the negative input (−) for comparator 315.

The comparators 315, 316, 317, 702, 704, and 318 generate thermometer bits (T6, T5, T4, T3, T2, T1) and the inverse of these bits (bT6, bT5, bT4, bT3, bT2, bT1). These thermometer bits represent the N-bit digital value 110 as described above. The thermometer bits will be a high logic level when positive input (+) exceeds the negative (−) input and will be a low logic level otherwise. The digital value 110, in the form of the thermometer bits (T6, T5, T4, T3, T2, T1) and inverse thermometer bits (bT6, bT5, bT4, bT3, bT2, bT1), controls the switches within the variable resistance load 312 as shown in FIG. 6. Further, the digital value 110 is used to form an N-bit value that provides part of the conversion digital output 132 as shown in FIG. 1.

Figure 8:
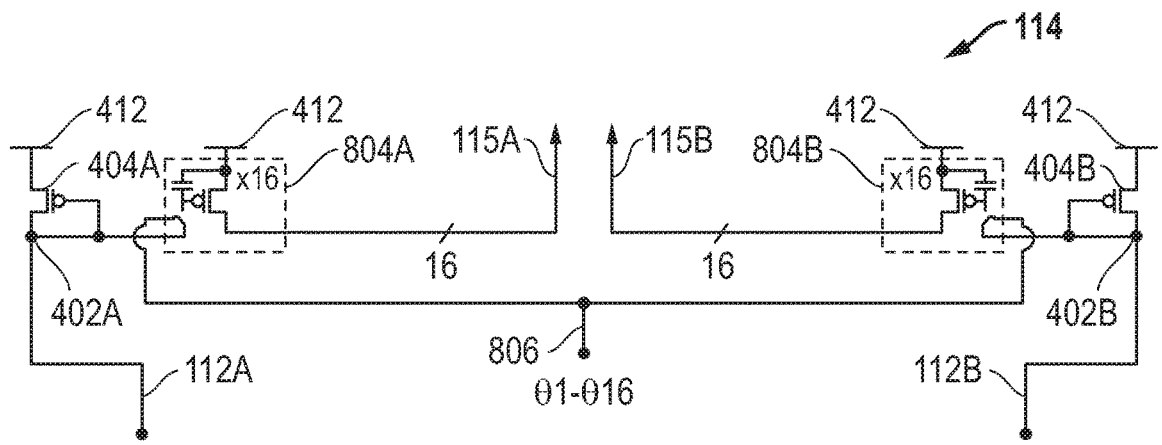
FIG. 8 is a circuit diagram of an example differential embodiment for the phased current generator that receives the differential residue currents from the current controlled MDAC (VIMDAC) of FIG. 6.

FIG. 8 is a circuit diagram of an example differential embodiment for the phased current generator 114 that receives the differential residue currents 112A/112B from the VIMDAC 108 of FIG. 6. For this differential embodiment, there are sixteen (16) positive-side PMOS transistors 804A and sixteen (16) negative-side PMOS transistors 804B that correspond to PMOS transistors 415, 416 . . . 417 in FIG. 4.

The positive-side current 112A is coupled to node 402A. Node 402A is coupled to the drain and gate of PMOS transistor 404A so that PMOS transistor 404A operates as a diode-connected device within a current mirror. The source of PMOS transistor 404A is coupled to node 412, and node 412 is coupled to a supply voltage ($V_{SUPPLY}$). The sources of PMOS transistors 804A are also coupled to node 412 and the supply voltage. The drains of PMOS transistors 804A are coupled to generate the time-interleaved currents 115A. The gates of PMOS transistors 804A are coupled to node 402A through switches. These switches are controlled by time-interleaved phased clock pulses (θ1-θ16) 806. When turned "ON," these switches connect the gates to node 402A thereby allowing the PMOS transistors 804A to mirror the current in PMOS transistor 404A. As such, PMOS transistors 804A and time-interleaved phased clock pulses (θ1-θ16) 806 provide copies of the current 112A as time-interleaved currents 115A to the array 120 of ICRO sub-ADCs.

The negative-side current 112B is coupled to node 402B. Node 402B is coupled to the drain and gate of PMOS transistor 404B so that PMOS transistor 804B operates as a diode-connected device within a current mirror. The source of PMOS transistor 804B is coupled to node 412, and node 412 is coupled to a supply voltage ($V_{SUPPLY}$). The sources of PMOS transistors 804B are also coupled to node 412 and the supply voltage. The drains of PMOS transistors 804B are coupled to generate the time-interleaved currents 115B. The gates of PMOS transistors 804B are coupled to node 402B through switches. These switches are controlled by time-interleaved phased clock pulses (θ1-θ16) 806. When turned "ON," these switches connect the gates to node 402B thereby allowing the PMOS transistors 804B to mirror the current in PMOS transistor 404B. As such, PMOS transistors 804B and time-interleaved phased clock pulses (θ1-θ16) 806 provide copies of the current 112B as time-interleaved currents 115B to the array 120 of ICRO sub-ADCs.

Figure 9A:
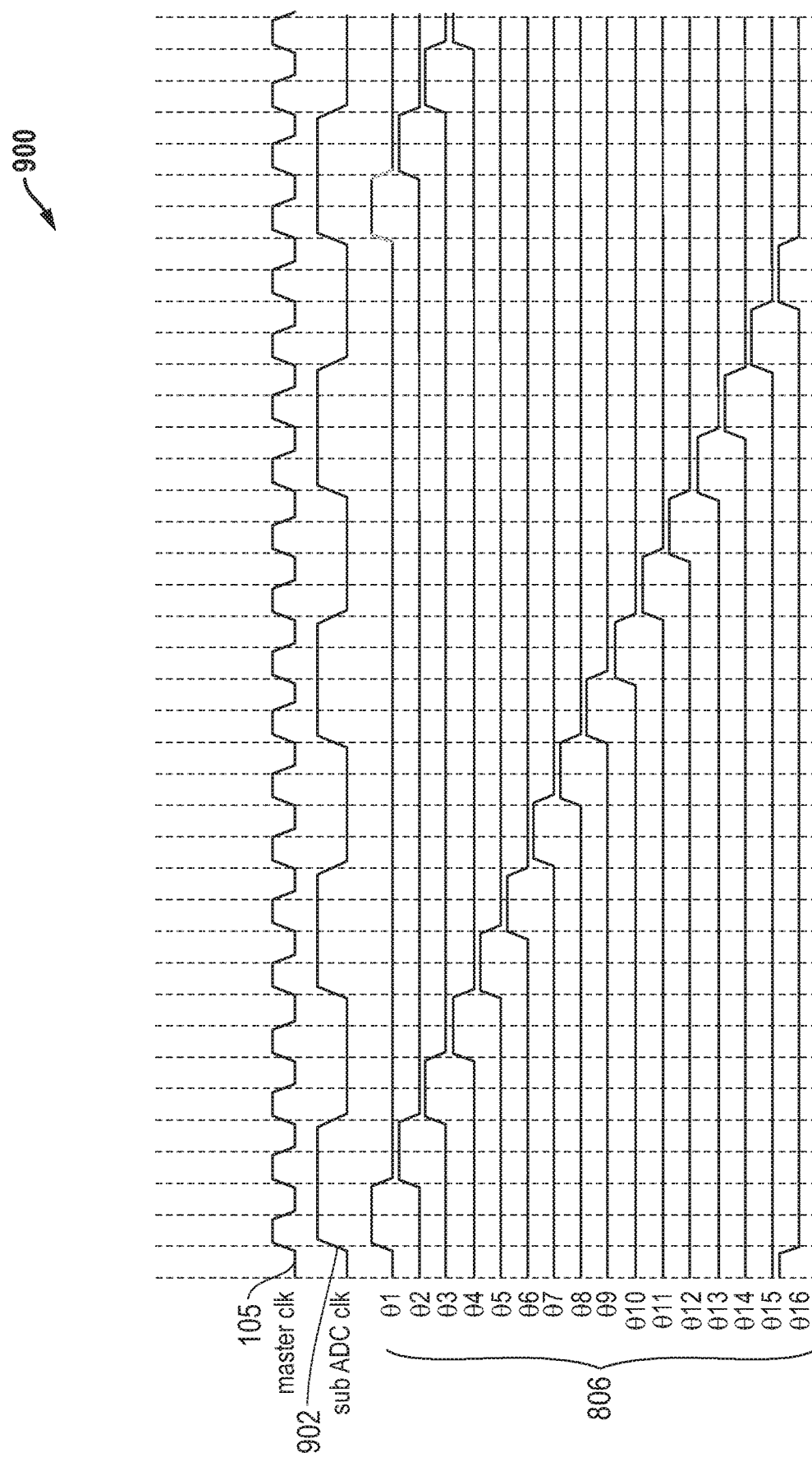
FIG. 9A is a timing diagram of an example embodiment for phased clock pulses that can be generated and output to the phased current generator shown in FIG. 8.

FIG. 9A is a timing diagram of an example embodiment 900 for phased clock pulses (θ1-θ16) 806 that can be generated and output to the embodiment for phased current generator 114 shown in FIG. 8. The sample clock 105 is used as a master clock. The sub-ADC clock 902 is based upon the sample clock 105 and is used to time the array 120 of sub-ADCs shown in FIG. 4. For the example embodiment 900, the sub-ADC clock 902 has a quarter of the frequency ($f_S/4$) of the global frequency ($f_S$) for the sample clock 105. Each of the phased clock pulses (θ1-θ16) 806 have a pulse that lasts for one cycle of the sample clock 105, and the pulse repeats every sixteen (16) cycles of the sample clock 105. As such, the pulses for the phased clock pulses (θ1-θ16) 806 do not overlap. As described above, the phased clock pulses (θ1-θ16) 806 are used to transfer the time-interleaved currents 115A/115B to the array 120 of ICRO sub-ADCs. More generally, it is noted that each of the phased clock pulses (θ1-θ16) 806 is pulsed to update the input to its respective sub-ADC with a period given by $f_S/X$ where X represents the number of different phases. For example, where there are sixteen (16) different phases as with the example embodiment 900 and where the sample clock has a frequency ($f_S$) of 4 gigahertz (GHz), each of the phased clock pulses (θ1-θ16) 806 is pulsed at a frequency of 250 megahertz (MHz), which is 4 GHz/16=250 MHz. It is further noted that the sub-ADC clock 902 can be implemented with different frequencies including frequencies slower or faster than those shown for embodiment 900. For example, the sub-ADC clock 902 can have a frequency higher than the global frequency ($f_S$) such as where averaging is used. Other variations can also be implemented.

Figure 9B:
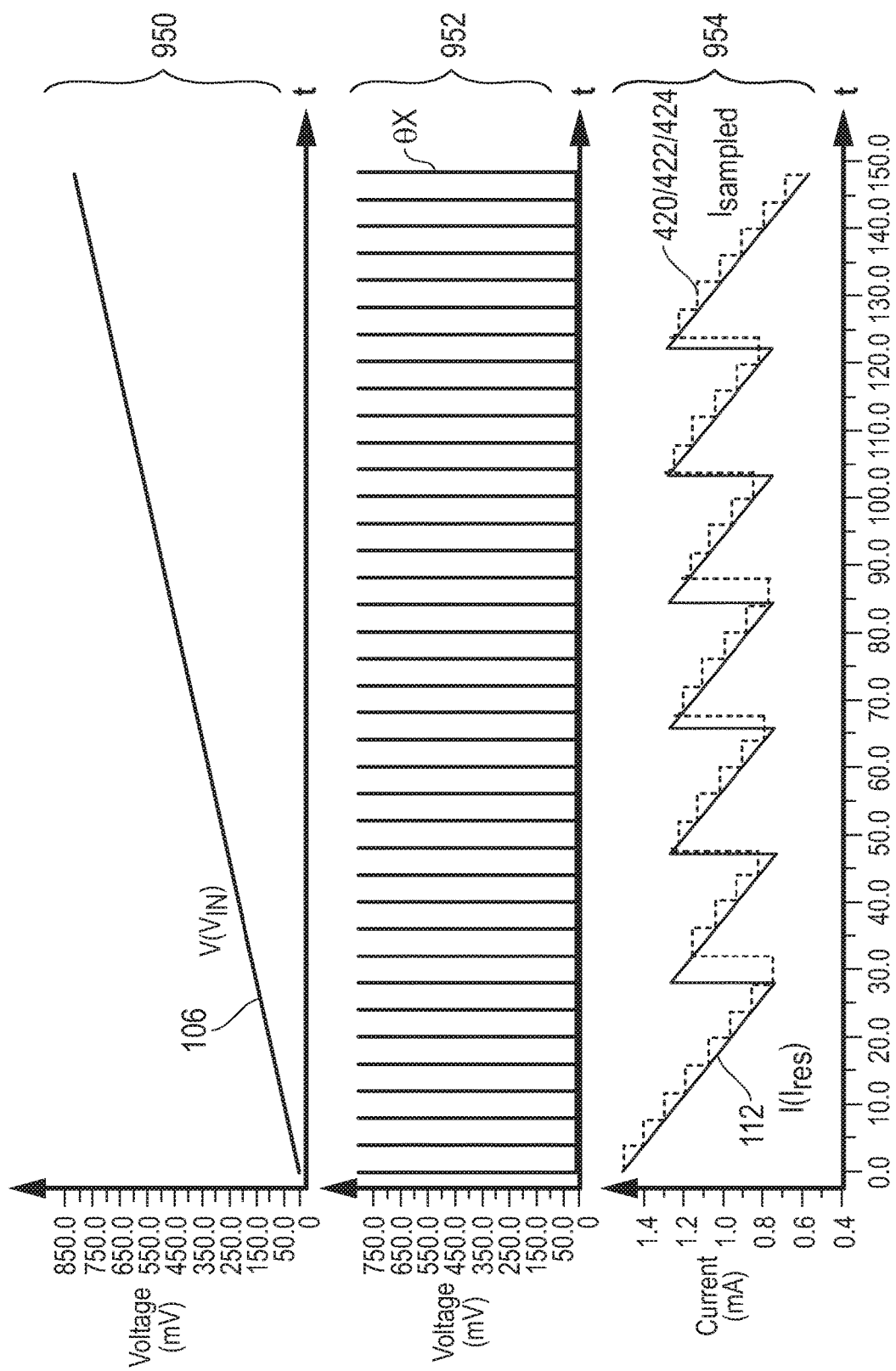
FIG. 9B provides timing diagrams of an example embodiment for the operation of the phased current generator to generate time-interleaved currents.

FIG. 9B provides timing diagrams of an example embodiment for the operation of the phased current generator 114 to generate time-interleaved currents 115. For this example embodiment as shown in diagram 950, the input voltage (V) 106 is assumed to ramp through the different operational regions for the VIMDAC 108, as determined by the array 314 of comparators shown in FIG. 3. Diagram 952 represents an example phased clock pulse θX that is applied to switch circuit 417 to sample the residue current (I) 112 as shown in FIG. 4. While one example phased clock pulse θX is shown, it is understood that each of the switch circuits 415, 416 . . . 417 would receive a phased clock pulses θ1, θ2 . . . θX. Diagram 954 shows the residue current (I) 112 and the resulting time-interleaved current 420/422/424 that results from the sampling caused by the phased clock pulses θ1, θ2 . . . θX being applied to one of the switch circuits 415, 416 . . . 417. Although a single sampled current (Isampled) is shown, it is noted that each of the switch circuits 415, 416 . . . 417 would cause a time-interleaved current 420, 422 . . . 424 to be generated as described with respect to FIG. 4. Together, these time-interleaved currents 115 are provided to the array 120 of ICRO sub-ADCs as also shown in FIG. 4.

Looking back to FIG. 5B, it is noted that equations can be derived for the operational current regions associated with the residue current 112 and the different trip voltages 330. Before deriving the various operating region equations, however, Vref is defined in relation to Vrefp−Vrefn. The relationship is $$Vref = \frac{Vrefp - Vrefn}{2},$$

therefore each of the reference voltages in FIG. 5B and carried into the circuit diagrams of FIGS. 6-8 as the different trip voltages 330 can be given as:

$$\frac{-5*Vref}{8} = \frac{-5*(Vrefp - Vrefm)}{16}$$

$$\frac{-3*Vref}{8} = \frac{-3*(Vrefp - Vrefm)}{16},$$

$$\ldots$$

$$,\frac{-5*Vref}{8} = \frac{5*(Vrefp - Vrefm)}{16}$$

Now that the comparator trip voltages 330 are established, the next step is to derive the various regions of operation equations for the residue current. The first step is to derive the required current for the easiest region of operation and apply this learning to other regions of operation.

Looking at the generic diagram in FIG. 5B, the residue current $$I_{res} = I_x - I_1 = I_x - \frac{Vin - V_{mid}}{Rin},$$

and for the case where Vin=$V_{mid}$ the current is defined to be equal to the center current for the ICRO sub-ADC. The topology specific operating point on the modified Robertson diagram is not the middle of the Robertson diagram for FIG. 5B but allows the circuit to operate without having to source and sink current in the voltage to current circuit. Hence, the implementation of the circuit block diagram as shown in FIGS. 6-8 enables the full operating range of the ICRO sub-ADCs. With this condition established, the current in each region is derived. It is noted that the equations below represent single-ended embodiments; however, the differential embodiment equations can be similarly derived.

As stated, the residue current $$I_{res} = I_x - I_1 = I_x - \frac{Vin - V_{mid}}{Rin}$$

and for the case where Vin=$V_{mid}$ $I_1$=0. With this condition and looking at FIG. 5B, we can establish that $I_{res}$=$I_x$ with $$I_x = \frac{V_{mid}}{Rx}$$

and $$R_x = \frac{V_{mid}}{I_c}.$$

If we let $R_x$=Rin and plug this back into the equation for $I_{res}$, then the following is reached:

$$I_{res} = \frac{V_{mid}}{Rx} - \frac{Vin - V_{mid}}{Rin} = I_c - \frac{Vin - V_{mid}}{\frac{V_{mid}}{I_c}} = 2*I_c - \frac{I_c * Vin}{V_{mid}}$$

where $$M = \frac{I_c}{V_{mid}}.$$

Now from the Robertson diagram in FIG. 5B, the transconductance slope is $$M = \frac{4*I_c}{Vrefp - Vrefm}$$

and the only place where this equation hold true is for $$V_{mid} = \frac{Vrefp - Vrefm}{4}.$$

Comparing against the comparator trip points established, this equation for the residue current holds true for the operating region $$\frac{-5*Vref}{8} < Vin < \frac{-3*Vref}{8}.$$

This results in $$I_{res} = \frac{4*I_c}{2} - M*Vin$$

with the slope given as $$M = \frac{4*I_c}{Vrefp - Vrefm}.$$

The next obvious region to derive the equations of operation is for me region $$Vin < \frac{-5*Vref}{8}.$$

In this region, set Vin=0 (or −Vref). For the condition where Vin=0 or as shown in diagram for differential operation Vin=−Vref, it is required the residue current to equal $3*I_c/2$ therefor the equation for this region is $$I_{res} = \frac{3*I_c}{2} - M*Vin.$$

The next region is the upper boundary region of operation is for a full-scale input. In this region of operation, $$\frac{5*Vref}{8} < Vin$$

where $$Vin = Vref = Vrefp - Vrefm, I_{res} = \frac{5*I_c}{2} - M*Vin.$$

Looking at the patterns, a set of operating equations for each operating region given as:

For $Vin < \frac{-5*Vref}{8}$, $I_{res} = \frac{3*I_c}{2} - M*Vin$

For $\frac{-5Vref}{8} < Vin < \frac{-3Vref}{8}$, $I_{res} = \frac{4*I_c}{2} - M*Vin$ For $\frac{-3Vref}{8} < Vin < \frac{-Vref}{8}$, $I_{res} = \frac{5*I_c}{2} - M*Vin$ For $\frac{-Vref}{8} < Vin < \frac{Vref}{8}$, $I_{res} = \frac{6*I_c}{2} - M*Vin$ For $\frac{Vref}{8} < Vin < \frac{3*Vref}{8}$, $I_{res} = \frac{7*I_c}{2} - M*Vin$ For $\frac{3*Vref}{8} < Vin < \frac{5*Vref}{8}$, $I_{res} = \frac{8*I_c}{2} - M*Vin$ For $\frac{5*Vref}{8} < Vin$, $I_{res} = \frac{9*I_c}{2} - M*Vin$, where $I_c$ is the center current for the ICRO sub-ADC.

For the required resistance calculations of the VIMDAC topology embodiment shown in FIG. 6, the determination is started by looking at the region for which the resistance is already defined $$R_x = \frac{V_{mid}}{I_c}.$$

In this region, $R_x$=Rin which holds true for $$\frac{-5Vref}{4} < Vin < \frac{-3*Vref}{8}.$$

In this region with $$V_{mid} = \frac{Vrefp - Vrefm}{4}, Rin = R_{unit} \| R_{unit} = \frac{(Vrefp - Vrefm)}{4*I_c}$$

where $$R_{unit} = \frac{(Vrefp - Vrefm)}{2*I_c}.$$

For the other regions of operation, Rx can be defined for each region. For $$Vin < \frac{-5*Vref}{8}, I_{res} = \frac{3*I_c}{2} - M*Vin$$

and $$I_{res} = I_x - I_1 = \frac{V_{mid}}{Rx} - \frac{Vin - V_{mid}}{Rin},$$

where $$Rin = \frac{(Vrefp - Vrefm)}{4*I_c}$$

and if use $$V_{mid} = \frac{Vrefp - Vrefm}{4}$$

given the constraint for this region, Rx can be defined. If the condition where Vin=0 is taken, Rx can be easily solved.

$$I_{res} = \frac{3*I_c}{2} - M*Vin = \frac{3*I_c}{2}$$

and additionally, $$I_{res} = I_x - I_1 = \frac{V_{mid}}{Rx} - \frac{-V_{mid}}{Rin}$$

and by combining these two equivalents, Rx can be found.

$$I_{res} = \frac{3*I_c}{2} = \frac{V_{mid}}{Rx} + \frac{V_{mid}}{Rin}$$

with Rin given as $$Rin = \frac{(Vrefp - Vrefm)}{4*I_c}$$

and $$V_{mid} = \frac{Vrefp - Vrefm}{4}$$

provides that $$Rx = \frac{Vrefp - Vrefm}{2*I_c} = R_{unit}.$$

For the region $$\frac{5*Vref}{8} < Vin, I_{res} = \frac{9*I_c}{2} - M*Vin$$

again is easily solved for $R_x$ by setting Vin=Vref=Vrefp−Vrefm which provides that $$Rx = \frac{Vrefp - Vrefm}{14*I_c} = R_{unit} \| R_{unit} \| R_{unit} \| R_{unit} \| R_{unit} \| R_{unit} \| R_{unit}.$$

Again, looking at the patterns, the resistance Rx for each section is nothing but a parallel set of resistors controlled by the comparator trip points for each region of operation.

Looking now to FIGS. 10A-B and 11A-B, example embodiments are provided for calibration of multi-stage analog-to-digital converters, including the multi-stage ADC embodiments described above. Due to non-idealities for circuit implementations (e.g., component mismatch, limited amplifier gain and bandwidth, etc.), missing output digital values or codes may exist in the digital conversion output 132 at the transition regions for an initial ADC, such as the N-bit VIMDAC 108 utilized in the multi-stage ADC 100. These missing digital values can occur due to various non-idealities in the VIMDAC 108 itself as well as any non-idealities in follow-on analog-to-digital conversion circuitry, such as the time-interleaved ADC 116. For example, even with an ideal N-bit VIMDAC 108, the missing digital values at the transition points become apparent if the follow-on ADC circuitry exhibits a nonlinear transfer function.

As described herein, calibration circuits and methods can be implemented to correct for these circuit non-idealities in multi-stage ADCs. The disclosed calibration embodiments implement efficient digital routines that approximate and correct these missing digital values. The calibration embodiments can also be implemented as background operations. Further, the disclosed calibration embodiments can be implemented with digital logic without requiring additional analog calibration circuitry or specialized predetermined calibration input sequences. Other advantages can also be achieved.

For one embodiment as described above with respect to FIG. 1, calibration logic 140 operates to generate calibration correction values 141 by tracking maximum/minimum values for the M-bit digital value 130 within different operational regions for the VIMDAC 108. In addition to the M-bit digital value 130, the calibration logic 140 also receives the N-bit digital value 110 from the VIMDAC 108 and uses this N-bit digital value 110 to determine a current region of operation for the VIMDAC 108. The calibration logic 140 executes one or more calibration algorithms to generate calibration correction values 141, such as digital correction values, that are used to adjust and correct the digital conversion output 132. For example, the digital correction values 141 can provide a correction value for each operational region for the VIMDAC 108, and these correction values 141 can be applied by the combiner 124 to adjust the digital output values 437, 439 . . . 441 being received from the sub-ADC array 120 as shown in more detail in FIG. 4. In operation, these digital correction values 141 effectively correct for linearity errors within the N-bit digital value 110 generated by the VIMDAC 108, within the M-bit digital value 130 generated by the additional analog-to-digital converter 116, or both. As such, non-idealities within both the MDAC 108 and the additional analog-to-digital converter 116 are compensated by the calibration embodiments described herein.

FIG. 10A is a flow diagram of an example embodiment 1000 for a calibration process that can be performed by calibration logic 140 for the multi-stage ADC 100 based upon the operation of an N-bit initial ADC, such as VIMDAC 108, which has multiple operational regions (e.g., Z number of regions) followed by an M-bit additional ADC. As shown in the example embodiment 1000, the calibration method keeps track of minimum and maximum values for the M-bit digital value 130 for each of the Z regions of operation for the N-bit initial ADC. The calibration method uses these minimum and maximum values to generate the correction values 141 for the different regions determined by the N-bit digital value 110. The correction values 141, which can be digital values, are then applied to correct the N-bit digital value 110 output by the VIMDAC 108, the M-bit digital value 130 output by the additional ADC 116, or the N+M-bit digital conversion output 132 for the multi-stage ADC 100. Further, as indicated above, the calibration method can be operated in the background during normal operations for the ADC 100.

Looking in more detail to FIG. 10A, the calibration process begins in block 1002. In block 1004, a new result (RESULT) for the M-bit digital value 130 is obtained, which is based upon the residue current 112 from the VIMDAC 108 for the example embodiment described above. In block 1006, the region (Z) for the residue current 112 is determined based upon the N-bit digital value 110. In block 1008, a determination is made whether the result is the first result for the region (Z). If "NO," then block 1012 is reached. If "YES," then block 1010 is reached where the maximum value for this region (REGION_MAX[Z]) is set to zero, and the minimum value for this region (REGION_MIN[Z]) is set to 1000. Block 1012 is then reached. In block 1012, a determination is made whether the result is greater than the current value stored for the maximum value. If "NO," then block 1016 is reached. If "YES," then block 1014 is reached where the maximum value for this region (REGION_MAX[Z]) is set to the current result, which is the current value for the M-bit digital value 130. Block 1016 is then reached. In block 1016, a determination is made whether the result is less than the current value stored for the minimum value. If "NO," then block 1020 is reached. If "YES," then block 1018 is reached where the minimum value for this region (REGION_MIN[Z]) is set to the current result, which is the current value for the M-bit digital value 130. Block 1020 is then reached. In block 1020, a correction value (CORRECTION[Z]) for the region is set to an expected range value for the region (EXPECTED[Z]) less a difference between the maximum value (REGION_MAX[Z]) and the minimum value (REGION_MIN[Z]). Flow then passes back to block 1004. It is noted that the expected range value (EXPECTED[Z]) is an ideal value that depends upon the number of bits (N) converted by the MDAC front end and the number of bits (M) converted by the additional ADC 116. It is also noted that the difference between the maximum value (REGION_MAX[Z]) and the minimum value (REGION_MIN[Z]) represents an approximated actual conversion range for that region. Further, it is noted that different or additional steps could also be implemented while still taking advantage of the techniques described herein.

FIG. 10B is a block diagram of an example embodiment for calibration logic 140 to implement the calibration process of FIG. 10A. A comparison engine 1052 receives as inputs the M-bit digital value 130 from the additional ADC (e.g., ADC 116) and the N-bit digital value 110 from the initial ADC (e.g. VIMDAC 108). The maximum values for regions 1-Z are stored in a lookup table 1054, and the minimum values for regions 1-Z are stored in a lookup table 1056. The expected range values for the regions 1-Z are stored in lookup table 1062. The comparison engine 1052 determines a region of operation for the initial ADC based upon the N-bit digital value 110, accesses the lookup tables 1054 and 1056, and updates the stored values as described for embodiment 1000 in FIG. 10A. For each region 1-Z, the correction engine 1060 compares the expected range values from lookup table 1062 to the difference between the maximum and minimum values from lookup tables 1054/1056 to generate correction values that are stored in table 1064. A controller 1058 is coupled to the comparison logic 1052 and the correction logic 1060 to facilitate control and timing for internal operations of the calibration logic 140. The calibration correction values 141 stored in table 1064 are then output to the combiner 124 to be used to adjust the M-bit digital value 130 and thereby correct for non-idealities in the operation of the initial ADC (e.g., VIMDAC 108), the operation of the additional ADC (e.g., time-interleaved ADC 116), or both. As described herein, the calibration correction values 141 are updated over time as updates occur in the maximum values or minimum values stored in lookup tables 1054/1056. The expected range values stored in lookup table 1062 can be programmable values or can be fixed values based upon the implementation for the multi-stage ADC. It is noted that that the calibration logic 140 can be implemented using one or more integrated circuits that are programmed to provide the functionality described herein. It is further noted that the tables 1054, 1056, 1062, and 1064 can be implemented as one or more non-transitory computer-readable mediums. Other circuitry and variations can also be implemented while still taking advantage of the calibration techniques described herein.

As described herein, therefore, the calibration circuits and methods of FIGS. 10A-B can be implemented as an efficient digital routine that approximates and corrects the missing digital values or codes in the transition regions for the front-end VIMDAC 108. The digital routine operates in the background by assessing each result for the M-bit digital value 130. For each given result, the digital routine determines from the N-bit digital value 110 from the MDAC 108 which region of the N-bit MDAC transfer function the code resides. Following this determination, the routine further determines if the current result represents either a maximum value or a minimum value for the region in which it resides. The calibration algorithm in effect stores an output value for a given region only if that particular value represents either a minimum value or a maximum value out of all of the values that have occurred for that given region. The difference between the maximum and minimum values represents an actual conversion range being implemented by a particular region. The difference between an expected range value and this actual conversion range represents a correction value that can be applied to adjust correct the actual conversion range. As time progresses, the calibration routine attains increasingly more accurate estimates of each region's minimum and maximum values. These minimum and maximum values are also compared between adjacent MDAC region transitions in order to calculate a correction value (e.g., jump code) between regions. This correction value is then added or subtracted out digitally in order to ultimately generate a corrected ADC output for the multi-stage ADC 100. Because this is happening continuously, the accuracy of this correction improves with time. After some period of time, the correction values 141 will resolve, and the digital conversion output 132 of the multi-stage ADC 100 no longer contains missing code errors at the MDAC transition regions.

Figure 11B:
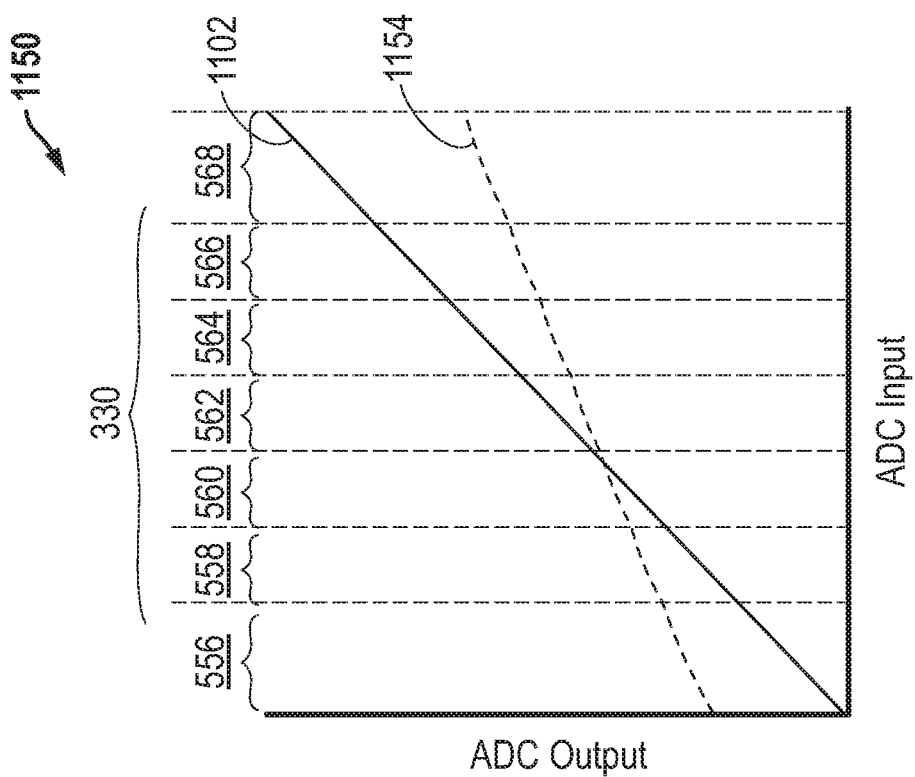
FIGS. 11A-B are representative diagrams of ADC outputs versus ADC inputs before and after the calibration process of FIG. 10 has been applied.
Figure 11A:
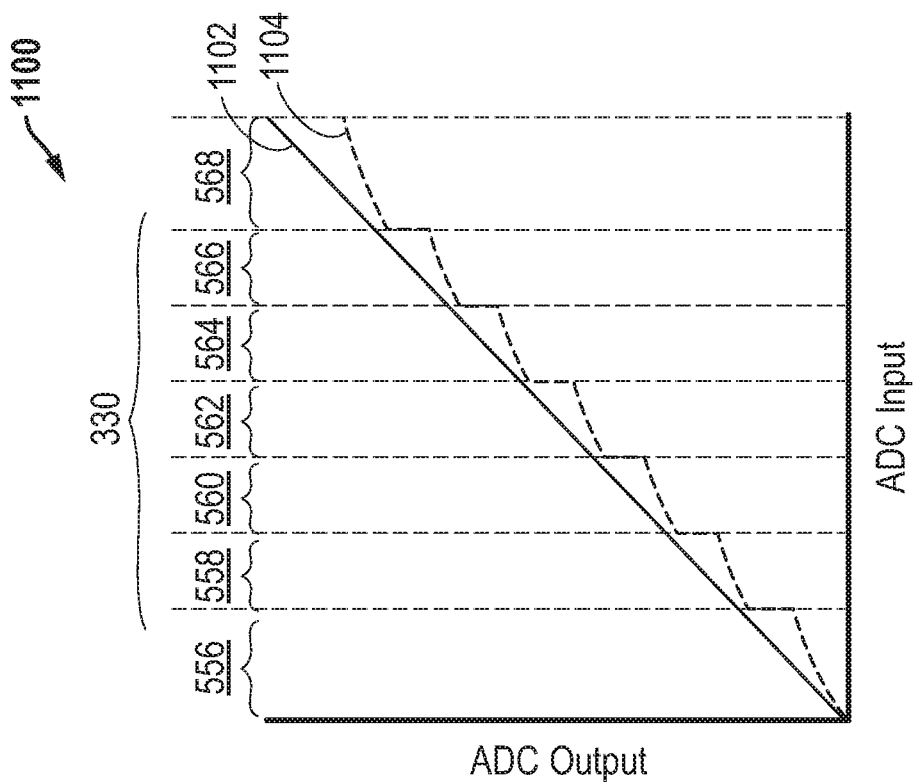

FIGS. 11A-B are representative diagrams of ADC outputs versus ADC inputs before and after the calibration process of FIG. 10 has been applied. These ADC transfer curves represent ADC outputs after the N bits associated with the VIMDAC 108 are added to generate the overall digital conversion output 132. For the example embodiment above, the VIMDAC 108 outputs the three MSBs (000 to 110) for the digital conversion output 132.

Looking first to FIG. 11A, a representative diagram is shown of an embodiment 1100 for an ideal ADC transfer curve 1102 and an actual ADC transfer curve 1104. As described herein, the front-end VIMDAC 108 determines the first N bits of the digital conversion output 132 depending an operational region for the residue current 112 based upon the voltage input 106. For the examples above, there are seven (7) distinct regions for the VIMDAC 108 (e.g., a 2.5-bit MDAC). For embodiment 1100, these distinct regions are regions 556, 558, 560, 562, 564, 566, and 568 (representing outputs 000, 001, 010, 011, 100, 101, 110, respectively) that are determined by the trip voltages 330 provided to the array 314 of comparators as shown in FIG. 3.

Looking now to FIG. 11B, a representative diagram is shown of an embodiment 1150 for an ideal ADC transfer curve 1102 and a corrected ADC transfer curve 1154 after correction values have been applied. The front-end VIMDAC 108 again determines the first N bits of the digital conversion output 132 depending an operational region for the residue current 112 based upon the voltage input 106. However, for embodiment 1150, correction values generated by the calibration logic 140 have been applied to correct for missing digital values or codes at region transitions. For the examples above, there are again seven (7) distinct regions for the VIMDAC 108 (e.g., a 2.5 bit MDAC). For embodiment 1100, these distinct regions are regions 556, 558, 560, 562, 564, 566, and 568 (representing outputs 000, 001, 010, 011, 100, 101, 110, respectively) that are determined by the trip voltages 330 provided to the array 314 of comparators as shown in FIG. 3. As shown, the corrected ADC transfer curve 1154 provides significantly improved linearity.

As described herein, a variety of embodiments can be implemented and different features and variations can be implemented, as desired.

For one embodiment, a multi-stage analog-to-digital converter (ADC) having calibration is disclosed including an initial analog-to-digital converter (ADC), an additional analog-to-digital converter (ADC), and calibration logic. The initial analog-to-digital converter (ADC) is coupled to receive an input signal and has an output signal and an N-bit digital value as outputs that are based upon the input signal. The additional analog-to-digital converter (ADC) is coupled to receive the output signal from the initial ADC and has an M-bit digital value as an output that is based upon the output signal from the initial ADC. The calibration logic has N-bit digital values from the initial ADC and M-bit digital values from the additional ADC as inputs and has correction values as outputs that are based upon differences between maximum values and minimum values for M-bit digital values associated with a plurality of different regions determined by the N-bit digital values. Further, digital conversion outputs for the multi-stage ADC are combinations of the N-bit digital values and the M-bit digital values corrected with the correction values.

In additional embodiments, the correction values are based upon differences between expected range values and actual range values, and the actual range values are determined from the differences between the maximum values and minimum values. In further additional embodiments, a maximum value and a minimum value are stored for each of the plurality of different regions.

In additional embodiments, the additional ADC is configured to operate at a sample rate to generate samples, and an M-bit digital value and an N-bit digital value are determined for each sample. In further embodiments, the M-bit digital value for each sample is stored as a maximum value if greater than a current maximum value for a current region and as a minimum value if less than a current minimum value for the current region.

In additional embodiments, the M-bit digital values are corrected by the correction values, and the N-bit digital values combined with the corrected M-bit digital values are provided as the digital conversion outputs for the multi-stage ADC. In further additional embodiments, the calibration logic is operable as a background operation during operation of the additional digital-to-analog converter.

In additional embodiments, the initial ADC includes a multiplying digital-to-analog converter (MDAC) coupled to receive a voltage as the input signal and to output the N-bit digital values based upon the voltage, and the MDAC operates within different regions based upon the N-bit digital values and has a current as the output signal. In further embodiments, the multi-stage ADC also includes a phased current generator coupled to receive the current from the MDAC and having a plurality of time-interleaved currents as outputs to the additional ADC. In still further embodiments, the additional ADC includes an array of sub analog-to-digital converters (sub-ADCs) coupled to receive the time-interleaved currents and a combiner coupled to receive digital values from the sub-ADCs, to receive the correction values, and to output the M-bit digital values corrected with the correction values.

For one embodiment, a method for multi-stage analog-to-digital conversion with calibration is disclosed including generating, with an initial analog-to-digital converter (ADC), N-bit digital values and output signals based upon input signals received by the initial ADC; generating, with an additional analog-to-digital converter (ADC), M-bit digital values based upon the output signals from the initial ADC; generating correction values based upon differences between maximum values and minimum values for M-bit digital values associated with a plurality of different regions determined by the N-bit digital values; and outputting N+M-bit corrected digital values based upon the N-bit digital values, the M-bit digital values, and the correction values. Further, the N+M-bit corrected digital values provide digital conversion outputs for the multi-stage analog-to-digital conversion.

In additional embodiments, the generating of the correction values includes determining differences between expected range values and actual range values, and the actual range values is determined from the differences between the maximum values and minimum values. In further additional embodiments, the method also includes storing a maximum value and a minimum value for each of the plurality of different regions.

In additional embodiments, the method also includes operating the additional ADC at a sample rate and determining an M-bit digital value and an N-bit digital value for each sample. In further embodiments, the method also includes storing the M-bit digital value for each sample as a maximum value if greater than a current maximum value for a current region and as a minimum value if less than a current minimum value for the current region.

In additional embodiments, the method also includes correcting the M-bit digital values with the correction values and providing digital conversion outputs by combining the N-bit digital values and the corrected M-bit digital values. In further additional embodiments, the generating and applying of the correction values are performed as a background operation.

In additional embodiments, the initial ADC includes a multiplying digital-to-analog converter (MDAC) receiving a voltage as the input signal, and the MDAC outputs the N-bit digital values based upon the voltage and operates within different regions based upon the N-bit digital values and has a current as the output signal. In further embodiments, the method also includes generating a plurality of time-interleaved currents based upon the current from the MDAC. In still further embodiments, the additional ADC includes an array of sub analog-to-digital converters (sub-ADCs) receiving the time-interleaved currents, and the method also includes correcting digital values from the sub-ADCs using the correction values and outputting the M-bit digital values corrected with the correction values.

It is further noted that the functional blocks, components, systems, devices, or circuitry described herein can be implemented using hardware, software, or a combination of hardware and software. For example, the disclosed embodiments can be implemented using one or more integrated circuits that are programmed to perform the functions, tasks, methods, actions, or other operational features described herein for the disclosed embodiments. The one or more integrated circuits can include, for example, one or more processors or configurable logic devices (CLDs) or a combination thereof. The one or more processors can be, for example, one or more central processing units (CPUs), controllers, microcontrollers, microprocessors, hardware accelerators, ASICs (application specific integrated circuit), or other integrated processing devices. The one or more CLDs can be, for example, one or more CPLDs (complex programmable logic devices), FPGAs (field programmable gate arrays), PLAs (programmable logic array), reconfigurable logic circuits, or other integrated logic devices. Further, the integrated circuits, including the one or more processors, can be programmed to execute software, firmware, code, or other program instructions that are embodied in one or more non-transitory tangible computer-readable mediums to perform the functions, tasks, methods, actions, or other operational features described herein for the disclosed embodiments. The integrated circuits, including the one or more CLDs, can also be programmed using logic code, logic definitions, hardware description languages, configuration files, or other logic instructions that are embodied in one or more non-transitory tangible computer-readable mediums to perform the functions, tasks, methods, actions, or other operational features described herein for the disclosed embodiments. In addition, the one or more non-transitory tangible computer-readable mediums can include, for example, one or more data storage devices, memory devices, flash memories, random access memories, read only memories, programmable memory devices, reprogrammable storage devices, hard drives, floppy disks, DVDs, CD-ROMs, or any other non-transitory tangible computer-readable mediums. Other variations can also be implemented while still taking advantage of the techniques described herein.

Unless stated otherwise, terms such as "first" and "second" are used to arbitrarily distinguish between the elements such terms describe. Thus, these terms are not necessarily intended to indicate temporal or other prioritization of such elements.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the invention is described herein with reference to specific embodiments, various modifications and changes can be made without departing from the scope of the present invention. Accordingly, the specification and figures are to be regarded in an illustrative rather than a restrictive sense, and such modifications are intended to be included within the scope of the present invention. Further, any benefits, advantages, or solutions to problems that are described herein with regard to specific embodiments are not intended to be construed as a critical, required, or essential feature or element of any or all the claims.

What is claimed is:

1. A multi-stage analog-to-digital converter (ADC) having calibration, comprising:
    an initial analog-to-digital converter (ADC) coupled to receive an input signal and having an output signal and an N-bit digital value as outputs, the output signal and the N-bit digital value being based upon the input signal;
    an additional analog-to-digital converter (ADC) coupled to receive the output signal from the initial ADC and having an M-bit digital value as an output, the M-bit digital value being based upon the output signal from the initial ADC; and
    calibration logic having N-bit digital values from the initial ADC and M-bit digital values from the additional ADC as inputs and having correction values as outputs, the correction values being based upon differences between maximum values and minimum values for M-bit digital values associated with a plurality of different regions determined by the N-bit digital values;
    wherein digital conversion outputs for the multi-stage ADC comprise combinations of the N-bit digital values and the M-bit digital values corrected with the correction values.

2. The multi-stage ADC of claim 1, wherein the correction values are based upon differences between expected range values and actual range values, the actual range values being determined from the differences between the maximum values and minimum values.

3. The multi-stage ADC of claim 1, wherein a maximum value and a minimum value are stored for each of the plurality of different regions.

4. The multi-stage ADC of claim 1, wherein the additional ADC is configured to operate at a sample rate to generate samples, and wherein an M-bit digital value and an N-bit digital value are determined for each sample.

5. The multi-stage ADC of claim 4, wherein the M-bit digital value for each sample is stored as a maximum value if greater than a current maximum value for a current region and as a minimum value if less than a current minimum value for the current region.

6. The multi-stage ADC of claim 1, wherein the M-bit digital values are corrected by the correction values, and wherein the N-bit digital values combined with the corrected M-bit digital values provide the digital conversion outputs for the multi-stage ADC.

7. The multi-stage ADC of claim 1, wherein the calibration logic is operable as a background operation during operation of the additional digital-to-analog converter.

8. The multi-stage ADC of claim 1, wherein the initial ADC comprises a multiplying digital-to-analog converter (MDAC) coupled to receive a voltage as the input signal and to output the N-bit digital values based upon the voltage, the MDAC operating within different regions based upon the N-bit digital values and having a current as the output signal.

9. The multi-stage ADC of claim 8, further comprising a phased current generator coupled to receive the current from the MDAC and having a plurality of time-interleaved currents as outputs to the additional ADC.

10. The multi-stage ADC of claim 9, wherein the additional ADC comprises an array of sub analog-to-digital converters (sub-ADCs) coupled to receive the time-interleaved currents and a combiner coupled to receive digital values from the sub-ADCs, to receive the correction values, and to output the M-bit digital values corrected with the correction values.

11. A method for multi-stage analog-to-digital conversion with calibration, comprising:
    generating, with an initial analog-to-digital converter (ADC), N-bit digital values and output signals based upon input signals received by the initial ADC;
    generating, with an additional analog-to-digital converter (ADC), M-bit digital values based upon the output signals from the initial ADC;
    generating correction values based upon differences between maximum values and minimum values for M-bit digital values associated with a plurality of different regions determined by the N-bit digital values; and
    outputting N+M-bit corrected digital values based upon the N-bit digital values, the M-bit digital values, and the correction values, the N+M-bit corrected digital values providing digital conversion outputs for the multi-stage analog-to-digital conversion.

12. The method of claim 11, wherein the generating of the correction values comprises determining differences between expected range values and actual range values, the actual range values being determined from the differences between the maximum values and minimum values.

13. The method of claim 11, further comprising storing a maximum value and a minimum value for each of the plurality of different regions.

14. The method of claim 11, further comprising operating the additional ADC at a sample rate, and determining an M-bit digital value and an N-bit digital value for each sample.

15. The method of claim 14, further comprising storing the M-bit digital value for each sample as a maximum value if greater than a current maximum value for a current region and as a minimum value if less than a current minimum value for the current region.

16. The method of claim 11, further comprising correcting the M-bit digital values with the correction values, and providing digital conversion outputs by combining the N-bit digital values and the corrected M-bit digital values.

17. The method of claim 11, wherein the generating and applying of the correction values are performed as a background operation.

18. The method of claim 11, wherein the initial ADC comprises a multiplying digital-to-analog converter (MDAC) receiving a voltage as the input signal, the MDAC outputting the N-bit digital values based upon the voltage and operating within different regions based upon the N-bit digital values and having a current as the output signal.

19. The method of claim 18, further comprising generating a plurality of time-interleaved currents based upon the current from the MDAC.

20. The method of claim 19, wherein the additional ADC comprises an array of sub analog-to-digital converters (sub-ADCs) receiving the time-interleaved currents, and further comprising correcting digital values from the sub-ADCs using the correction values and outputting the M-bit digital values corrected with the correction values.

* * * * *